(12) United States Patent
Bok

(10) Patent No.: US 11,983,345 B2
(45) Date of Patent: May 14, 2024

(54) ELECTRONIC APPARATUS AND METHOD OF DRIVING THE SAME

(71) Applicant: Samsung Display Co., LTD., Yongin-si (KR)

(72) Inventor: Seung-lyong Bok, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/117,212

(22) Filed: Mar. 3, 2023

(65) Prior Publication Data
US 2023/0236688 A1 Jul. 27, 2023

Related U.S. Application Data

(63) Continuation of application No. 16/795,599, filed on Feb. 20, 2020, now Pat. No. 11,599,211.

(30) Foreign Application Priority Data

Mar. 26, 2019 (KR) .......................... 10-2019-0034505

(51) Int. Cl.
*G06F 3/041* (2006.01)
*H10K 59/00* (2023.01)
(Continued)

(52) U.S. Cl.
CPC .......... *G06F 3/0412* (2013.01); *G06F 3/0414* (2013.01); *H10K 59/40* (2023.02); *H10K 59/00* (2023.02); *H10K 77/111* (2023.02)

(58) Field of Classification Search
CPC ..... G06F 3/0414; G06F 3/0412; H10K 59/40; H10K 59/00; H10K 77/111
(Continued)

(56) References Cited

U.S. PATENT DOCUMENTS 7,759,863 B2   7/2010   Kim et al.
8,094,134 B2   1/2012   Suzuki et al.
(Continued)

FOREIGN PATENT DOCUMENTS

CN   104375573 A   2/2015
CN   107871769 A   4/2018
(Continued)

OTHER PUBLICATIONS

Non-Final Office Action dated Jul. 22, 2021, in U.S. Appl. No. 16/795,599.
(Continued)

*Primary Examiner* — Jimmy H Nguyen
(74) *Attorney, Agent, or Firm* — CANTOR COLBURN LLP

(57) ABSTRACT

An electronic apparatus including a window having a front surface, a rear surface opposite to the front surface, and a plurality of side surfaces connecting the front surface and the rear surface, an electronic panel displaying an image through the front surface and including a surface corresponding to at least one of the side surfaces, a pressure sensing unit sensing an external pressure, and a housing unit accommodating the electronic panel and the pressure sensing unit. The external pressure is applied to a first surface among the side surfaces, and the pressure sensing unit is disposed on a second surface opposite to the first surface.

15 Claims, 28 Drawing Sheets

(51) Int. Cl.
*H10K 59/40* (2023.01)
*H10K 77/10* (2023.01)

(58) Field of Classification Search
USPC .................................. 345/173, 174, 76, 156
See application file for complete search history.

(56) References Cited

U.S. PATENT DOCUMENTS

| | | | |
|---|---|---|---|
| 8,698,777 B2 | 4/2014 | Endo et al. | |
| 9,430,180 B2 | 8/2016 | Hirakata et al. | |
| 9,696,223 B2 | 7/2017 | Lisseman et al. | |
| 10,007,371 B2 | 6/2018 | Kim et al. | |
| 10,055,039 B2 | 8/2018 | Myers et al. | |
| 10,551,969 B2 | 2/2020 | Jeong et al. | |
| 10,795,417 B2 | 10/2020 | Bok et al. | |
| 10,955,957 B2 | 3/2021 | Lee et al. | |
| 2006/0147700 A1 | 7/2006 | Papakostas et al. | |
| 2013/0076649 A1* | 3/2013 | Myers .................. | G06F 3/0488 361/679.01 |
| 2014/0016048 A1 | 1/2014 | Omote et al. | |
| 2015/0043142 A1 | 2/2015 | Jang et al. | |
| 2015/0138041 A1 | 5/2015 | Hirakata et al. | |
| 2015/0379923 A1 | 12/2015 | Lee et al. | |
| 2016/0035290 A1* | 2/2016 | Kim ...................... | G06F 3/0446 345/174 |
| 2017/0024047 A1 | 1/2017 | Kung | |
| 2017/0060283 A1 | 3/2017 | Sohn et al. | |
| 2017/0205923 A1 | 7/2017 | Shim et al. | |
| 2017/0236877 A1 | 8/2017 | Jeong | |
| 2017/0336970 A1 | 11/2017 | Kim | |
| 2018/0053455 A1 | 2/2018 | Zhang et al. | |
| 2019/0073077 A1* | 3/2019 | Kim ...................... | G06F 3/0445 |
| 2020/0042132 A1 | 2/2020 | Kong et al. | |

FOREIGN PATENT DOCUMENTS

| | | |
|---|---|---|
| CN | 108089744 A | 5/2018 |
| CN | 108388394 A | 8/2018 |
| KR | 10-1380693 | 4/2014 |
| KR | 10-1681305 | 12/2016 |
| KR | 10-2017-0024672 | 3/2017 |
| KR | 10-2017-0025620 | 3/2017 |
| KR | 10-2017-0026046 | 3/2017 |
| KR | 10-2017-0085344 | 7/2017 |
| KR | 10-1866395 | 6/2018 |
| KR | 10-2019-0027801 | 3/2019 |

OTHER PUBLICATIONS

Final Office Action dated Nov. 18, 2021, in U.S. Appl. No. 16/795,599.
Non-Final Office Action dated Mar. 31, 2022, in U.S. Appl. No. 16/795,599.
Final Office Action dated Jul. 26, 2022, in U.S. Appl. No. 16/795,599.
Notice of Allowance dated Nov. 8, 2022 in U.S. Appl. No. 16/795,599.
Korean Office Action dated Jul. 17, 2023, in Korean Patent Application No. 10-2019-0034505.

* cited by examiner

ELECTRONIC APPARATUS AND METHOD OF DRIVING THE SAME

CROSS-REFERENCE TO RELATED APPLICATION

This application is a Continuation of U.S. patent application Ser. No. 16/795,599, filed on Feb. 20, 2020, and claims priority from and the benefit of Korean Patent Application No. 10-2019-0034505, filed on Mar. 26, 2019, which are hereby incorporated by reference for all purposes as if fully set forth herein.

BACKGROUND

Field

Exemplary embodiments of the invention relate generally to an electronic apparatus and a method of driving the same and, more specifically, to an electronic apparatus capable of sensing an external pressure and a method of driving the electronic apparatus.

Discussion of the Background

An electronic apparatus may typically be activated in response to electrical signals applied thereto. Such an electronic apparatus may include a display unit that displays an image and an input sensing unit that senses an external input. The external input can be provided in various forms, such as touch, pressure, light, or heat.

The electronic apparatus includes a variety of conductive patterns activated by the electrical signals. Areas in which the conductive patterns are activated display information or respond to the touch applied thereto from the outside. The electronic apparatus senses the touch applied thereto to provide a user with information related to the touch or operates various applications based on the sensed touch.

The above information disclosed in this Background section is only for understanding of the background of the inventive concepts, and, therefore, it may contain information that does not constitute prior art.

SUMMARY

Devices constructed according to exemplary embodiments of the invention may provide an electronic apparatus capable of sensing a position and an intensity of a pressure applied thereto from the outside and driving method of the electronic apparatus.

Additional features of the inventive concepts will be set forth in the description which follows, and in part will be apparent from the description, or may be learned by practice of the inventive concepts.

Exemplary embodiments of the inventive concepts provide an electronic apparatus including a window including a front surface and a plurality of side surfaces bent from the front surface, an electronic panel displaying an image through the front surface and including a surface corresponding to at least one of the side surfaces, a pressure sensing unit sensing an external pressure, and a housing unit accommodating the electronic panel and the pressure sensing unit. The external pressure is applied to a first surface among the side surfaces, and the pressure sensing unit is disposed on a second surface opposite to the first surface.

The pressure sensing unit may be disposed between the window and the housing unit.

The pressure sensing unit may be disposed between the window and the electronic panel.

The electronic apparatus may further include an additional pressure sensing unit disposed between the housing unit and the window or between the housing unit and the electronic panel. The pressure sensing unit may include a first pressure sensing unit disposed on the first surface and a second pressure sensing unit disposed on the second surface, and the additional pressure sensing unit may include third and fourth pressure sensing units making contact with at least one of the window and the electronic panel, spaced apart from each other, and disposed in the housing unit.

The pressure sensing unit may include a first pattern having conductivity and a second pattern having the conductivity and spaced apart from the first pattern.

The pressure sensing unit may sense a variation in capacitance between the first pattern and the second pattern.

The electronic apparatus may further include a first panel that includes a resin making contact with the first pattern and the second pattern and a plurality of conductive nano-particles distributed in the resin. The pressure sensing unit may sense a variation in resistance of the first panel.

The electronic apparatus may further include a support member disposed between the electronic panel and the housing unit. The pressure sensing unit may be disposed between the support member and the electronic panel.

The electronic panel may include a base substrate, a thin film transistor disposed on the base substrate, a light emitting device connected to the thin film transistor, and an encapsulation layer covering the light emitting device, and the pressure sensing unit may be disposed between the base substrate and the window.

The pressure sensing unit may be disposed on the encapsulation layer.

The pressure sensing unit may be disposed between the base substrate and the thin film transistor.

The electronic apparatus may further include a sensing unit disposed on the encapsulation layer to sense an external input. The sensing unit may include a first sensing insulating layer disposed on the encapsulation layer, a second sensing insulating layer disposed on the first sensing insulating layer, a first sensing conductive pattern disposed between the first sensing insulating layer and the second sensing insulating layer, and a second sensing conductive pattern disposed on the second sensing insulating layer, and the pressure sensing unit may be disposed on a same layer as the first sensing conductive pattern.

At least a portion of the second sensing conductive pattern may be connected to the first sensing conductive pattern.

The first sensing insulating layer may include a resin and a plurality of conductive nano-particles distributed in the resin.

The electronic panel may include an active area through which the image is displayed and a peripheral area defined adjacent to the active area, and the pressure sensing unit may overlap with the active area.

The electronic panel may include an active area through which the image is displayed and a peripheral area defined adjacent to the active area, and the pressure sensing unit may overlap with the peripheral area.

The electronic apparatus may further include an electronic module accommodated in the housing unit and photographing an external subject, and the electronic panel may be provided with a hole through the electronic panel defined to overlap with the electronic module.

Exemplary embodiments of the inventive concepts may provide a method of driving an electronic apparatus including applying an external pressure to at least one surface among a front surface of the electronic apparatus, a rear surface opposite to the front surface, and first, second, third, and fourth side surfaces connected to and bent from the front surface and sensing the external pressure from a surface opposite to the one surface.

The method may further include sensing the external pressure from the one surface.

At least one of the first, second, third, and fourth side surfaces may be activated when the external pressure is substantially simultaneously applied to the front surface and the rear surface.

At least one of the third and fourth side surfaces may be activated when the external pressure is substantially simultaneously applied to the first side surface and the second side surface opposite to the first side surface.

According to the above, the surface to which the pressure is directly applied may be separated from the surface from which the pressure is sensed. Thus, the sensitivity and accuracy for the sensing of the change in pressure may be improved.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
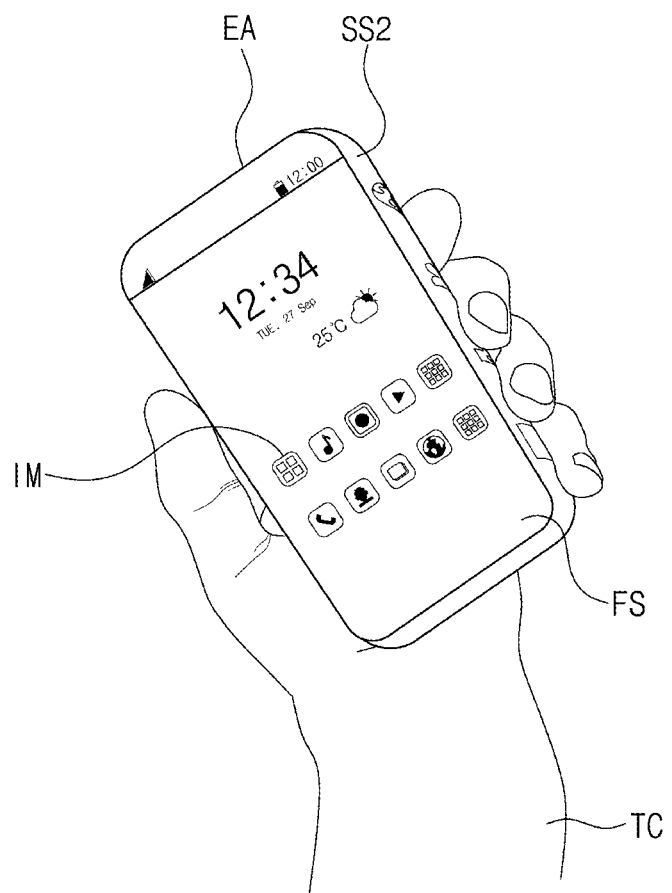
FIG. 1A is a perspective view showing an electronic apparatus according to an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 1B:
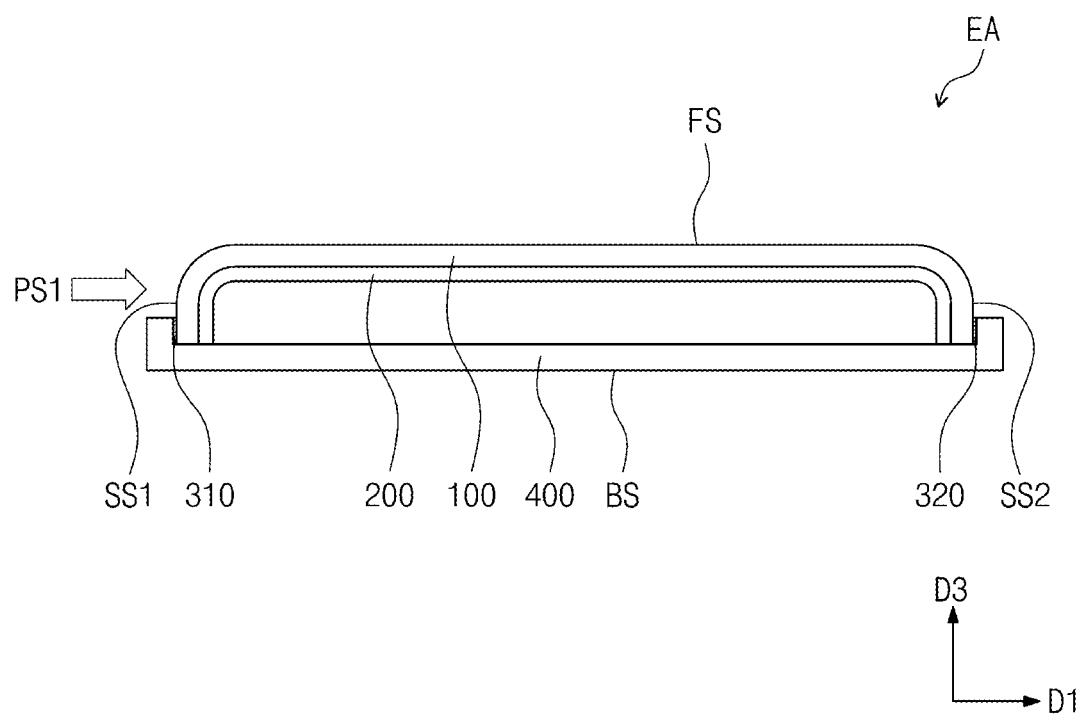
FIG. 1B is a cross-sectional view showing the electronic apparatus shown in FIG. 1A.
Figure 2A:
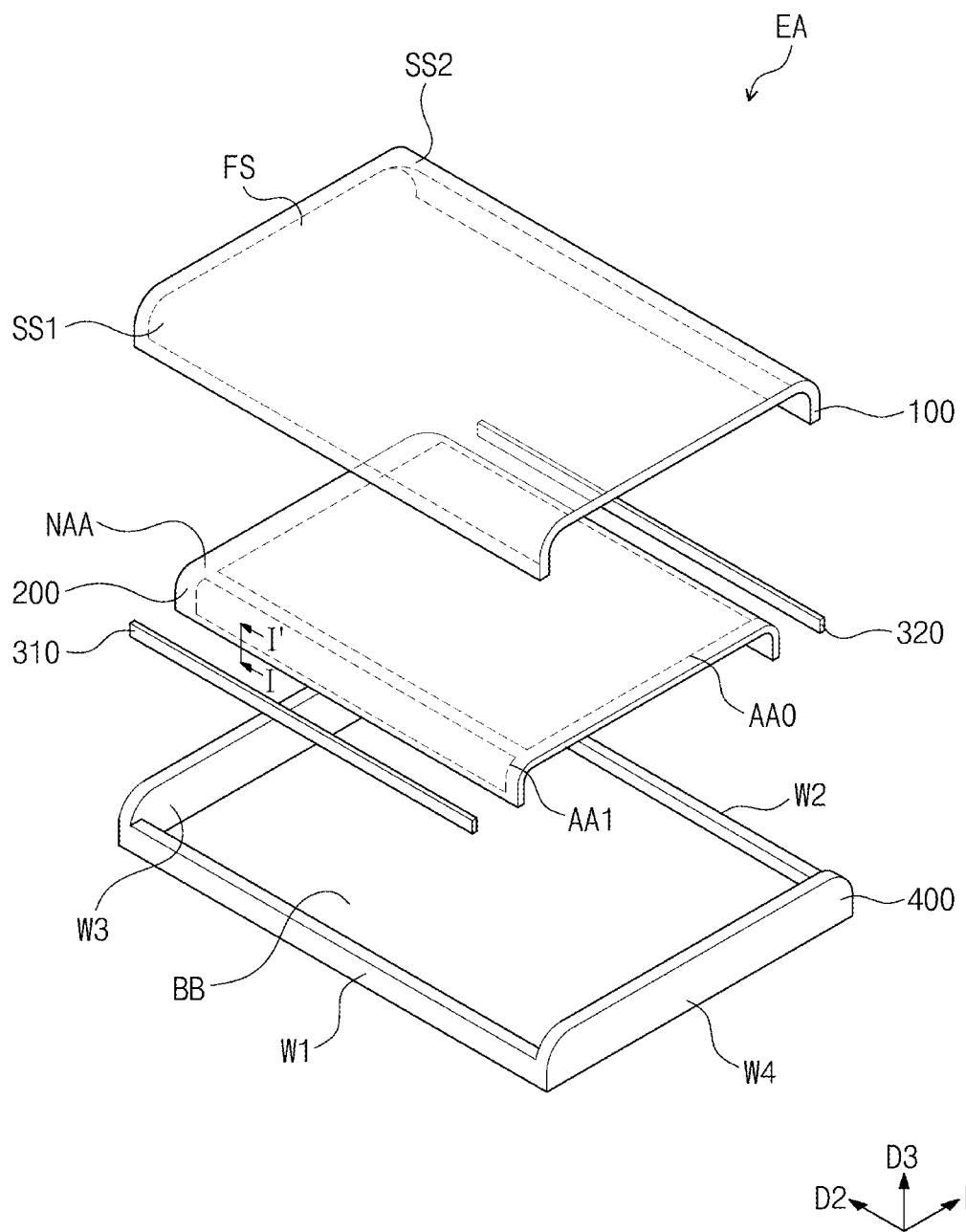
FIG. 2A is an exploded perspective view showing the electronic apparatus shown in FIG. 1A.
Figure 2B:
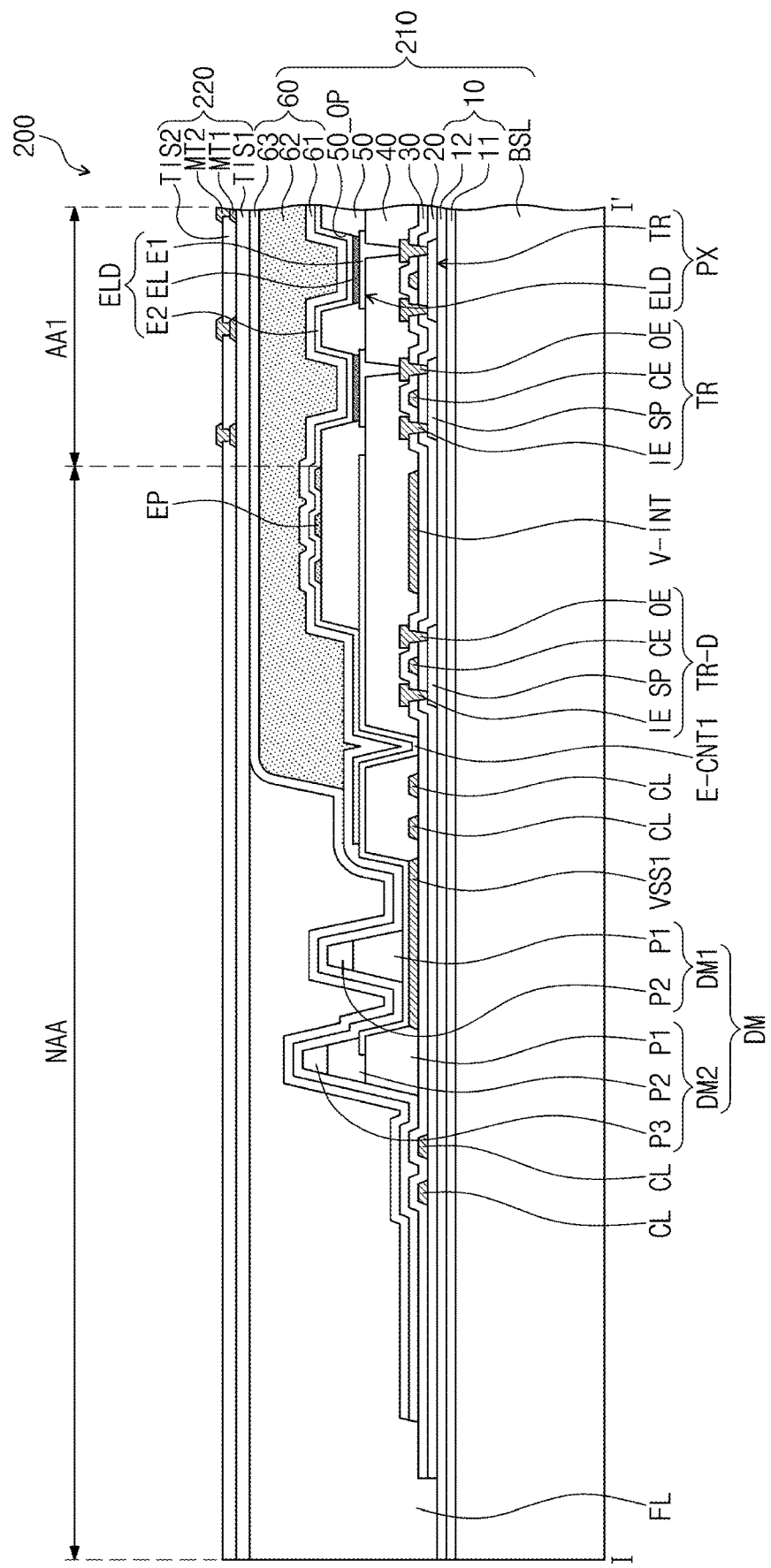
FIG. 2B is a cross-sectional view showing some components of the electronic apparatus taken along a line I-I' shown in FIG. 2A.

FIG. 1A is a perspective view showing an electronic apparatus EA according to an exemplary embodiment. FIG. 1B is a cross-sectional view showing the electronic apparatus EA shown in FIG. 1A. FIG. 2A is an exploded perspective view showing the electronic apparatus EA according to an exemplary embodiment. FIG. 2B is a cross-sectional view showing some components of the electronic apparatus EA shown in FIG. 2A. Hereinafter, the inventive concepts will be described with reference to FIGS. 1A to 2B.

The electronic apparatus EA may display an image IM and may sense an external input TC in response to electrical signals. The external input TC may include various types of external inputs, such as a portion of user's body, light, heat, or pressure. In addition, the external input TC may include an actual physical touch or proximity touch. In the present exemplary embodiment, the electronic apparatus EA is shown as a smartphone, and the external input TC is shown as a user's hand. In the present exemplary embodiment, the external input TC may be divided into a force and a touch.

The electronic apparatus EA may include a front surface FS, a first side surface SS1, a second side surface SS2, and a rear surface BS. The front surface FS may be perpendicular to a third direction D3 and may be a surface on which the image IM is displayed toward the third direction D3. The user may control the electronic apparatus EA or may acquire information from the electronic apparatus EA via the image IM displayed on the front surface FS.

The rear surface BS may be opposite to the front surface FS. In FIG. 1A, the rear surface BS may be a surface supported by a palm of the user's hand.

The first side surface SS1 may be bent from the front surface FS to be perpendicular to a first direction D1. The first side surface SS1 may be supported by a thumb of the user's hand. That is, the first side surface SS1 may be a surface to which an external pressure PS1 of the external input TC is substantially applied.

The second side surface SS2 may be bent from the front surface FS to face the first side surface SS1. The second side surface SS2 may be supported by remaining four fingers of the user's hand. In the present exemplary embodiment, the second side surface SS2 may face the surface, to which the external pressure PS1 of the external input TC is substantially applied, to sense the external pressure PS1. That is, in the present exemplary embodiment, the surface to which the external pressure PS1 is applied may be different from the surface that senses the external pressure PS1. This will be described in detail later.

The electronic apparatus EA may include a window 100, an electronic panel 200, a plurality of pressure sensing units 310 and 320, and a housing unit 400. The window 100 may be optically transparent. In the present exemplary embodiment, the window 100 may include glass, plastic, or film.

The window 100 may include at least a portion curved on a cross section defined by the first direction D1 and a second direction D2. The front surface FS, the first side surface SS1, and the second side surface SS2 may be provided by a substantially single window 100.

The electronic panel 200 is configured to display the image IM. The electronic panel 200 may be one of an organic light emitting display panel, a quantum dot light emitting display panel, a liquid crystal display panel, an electrophoretic display panel, and an electrowetting display panel.

In the present exemplary embodiment, the electronic panel 200 may include at least a portion curved along a shape of the window 100. The electronic panel 200 may include an upper surface to face each of the front surface FS, the first side surface SS1, and the second side surface SS2. A plurality of active areas AA0 and AA1 may be defined on the upper surface. A plurality of pixels may be arranged in each of the active areas AA0 and AA1. Images independent from or associated with each other may be displayed through the active areas AA0 and AA1.

An active area may be defined on an upper surface of the electronic panel 200, which is bent to correspond to the second side surface SS2. Accordingly, the image IM may be displayed through at least one of the first side surface SS1 and the second side surface SS2 as well as the front surface FS in accordance with a size and a shape of the active area provided by the electronic panel 200. However, the inventive concepts are not limited to this particular embodiment.

As shown in FIG. 2B, the electronic panel 200 may include a display unit 210 and an input sensing unit 220. For the convenience of explanation, FIG. 2B shows the cross section taken along a line I-I' of FIG. 2A.

The display unit 210 may include a base substrate BSL, a pixel PX, and a plurality of insulating layers 10, 20, 30, 40, 50, and 60 (hereinafter, respectively referred to as "first, second, third, fourth, fifth, and sixth insulating layers"). For the convenience of explanation, FIG. 2B shows a second thin film transistor TR (hereinafter, referred to as a "pixel transistor") and a light emitting device ELD among components of the pixel PX as a representative example.

The base substrate BSL may include an insulating material. For example, the base substrate BSL may include polyimide (PI). Therefore, at least the portion of the electronic panel 200 may be easily curved as shown in FIG. 2B. However, this is merely exemplary. The base substrate BSL may have a rigidity. For example, the base substrate BSL may include various materials, such as glass and plastic, however, it should not be limited thereto or thereby.

The first insulating layer 10 may be disposed on the base substrate BSL. The first insulating layer 10 may cover a front surface of the base substrate BSL. The first insulating layer may include a barrier layer 11 and a buffer layer 12.

The barrier layer 11 may include an inorganic material. The barrier layer 11 may prevent oxygen or moisture from entering the pixel PX through the base substrate BSL. The buffer layer 12 may include an inorganic material. The buffer layer 12 may have a surface energy lower than the base substrate BSL such that the pixel PX is stably formed on the base substrate BSL.

For the convenience of explanation, FIG. 2B shows each of the barrier layer 11 and the buffer layer 12 as a single layer. However, this is merely exemplary. Each of the barrier layer 11 and the buffer layer 12 may be provided in a plural number and may be alternately stacked with each other. Alternately, at least one of the barrier layer 11 and the buffer layer 12 may be provided in a plural number or may be omitted.

The pixel transistor TR includes a semiconductor pattern SP, a control electrode CE, an input electrode IE, and an output electrode OE. The semiconductor pattern SP is disposed on the base substrate BSL. The semiconductor pattern SP includes a semiconductor material. The control electrode CE is spaced apart from the semiconductor pattern SP with the second insulating layer 20 interposed therebetween.

The input electrode IE and the output electrode OE are spaced apart from the control electrode CE with the third insulating layer 30 interposed therebetween. The input electrode IE and the output electrode OE of the pixel electrode TR are respectively connected to one side and the other side of the semiconductor pattern SP after penetrating through the second insulating layer 20 and the third insulating layer 30.

The fourth insulating layer 40 is disposed on the third insulating layer 30 to cover the input electrode IE and the output electrode OE. The fourth insulating layer 40 includes an organic material and/or an inorganic material and has a single-layer or multi-layer structure.

In the pixel transistor TR, the semiconductor pattern SP may be disposed on the control electrode CE. Alternately, the semiconductor pattern SP may be disposed on the input electrode IE and the output electrode OE. In other embodiments, the input electrode IE and the output electrode OE may be disposed on the same layer as the semiconductor pattern SP and may directly make contact with the semiconductor pattern SP. The pixel transistor TR according to the exemplary embodiment of the inventive concepts may have various structures and should not be particularly limited.

The light emitting device ELD is disposed on the fourth insulating layer 40. The light emitting device ELD includes a first electrode E1, a light emitting layer EL, and a second electrode E2. The first electrode E1 is connected to the pixel transistor TR after penetrating through the fourth insulating layer 40. Although not shown in figures, the electronic panel 200 further includes a separate connection electrode disposed between the first electrode E1 and the pixel transistor TR, and in this case, the first electrode E1 is electrically connected to the pixel transistor TR via the connection electrode.

The fifth insulating layer 50 is disposed on the fourth insulating layer 40. The fifth insulating layer 50 is provided with an opening 50_OP defined therethrough. At least a portion of the first electrode E1 is exposed through the opening 50_OP. The fifth insulating layer 50 includes an organic material. In the present exemplary embodiment, the fifth insulating layer 50 may be, but not limited to, a pixel definition layer.

The light emitting layer EL may be located in the opening 50_OP to be disposed on the first electrode E1 exposed through the opening 50_OP. The light emitting layer EL may include a light emitting material. For example, the light emitting layer EL may include at least one material among materials respectively emitting red, green, and blue lights and may include a fluorescent material or a phosphorescent material. The light emitting layer EL may include an organic light emitting material or an inorganic light emitting material. The light emitting layer EL may emit the light in response to a difference in electric potential between the first electrode E1 and the second electrode E2.

The second electrode E2 may be disposed on the light emitting layer EL. The second electrode E2 may face the first electrode E1. The second electrode E2 may extend from the active area AA1 to a peripheral area NAA to have a single unitary form. The second electrode E2 may be commonly provided in the pixels. The light emitting device ELD disposed in each of the pixels may receive a second power voltage via the second electrode E2.

The second electrode E2 may include a transmissive conductive material or a semi-transmissive conductive material. Accordingly, the light generated by the light emitting layer EL may easily travel to the front surface FS (refer to FIG. 1A) via the second electrode E2. However, this is merely exemplary, and the light emitting device ELD according to the exemplary embodiment of the inventive concepts may be operated in a rear surface light emitting manner in which the first electrode E1 includes the transmissive or semi-transmissive material or a both surface light emitting manner in which the light is emitted to both of the front and rear surfaces, and should not be limited to a specific embodiment.

The sixth insulating layer 60 may be disposed on the light emitting device ELD to encapsulate the light emitting device ELD. In the present exemplary embodiment, the sixth insulating layer 60 may be an encapsulation layer. The sixth insulating layer 60 may extend from the active area AA1 to the peripheral area NAA to have a single unitary form. The sixth insulating layer 60 may be commonly provided in the pixels. Although not shown in figures, a capping layer may be further disposed between the second electrode E2 and the sixth insulating layer 60 to cover the second electrode E2.

The sixth insulating layer 60 may include a first inorganic layer 61, an organic layer 62, and a second inorganic layer 63, which are sequentially stacked in a thickness direction of the electronic panel 200. In the present exemplary embodiment, each of the first inorganic layer 61, the organic layer 62, and the second inorganic layer 63 may have a single-layer structure, however, it should not be limited thereto or thereby. At least one of the first inorganic layer 61, the organic layer 62, and the second inorganic layer 63 may be provided in a plural number or omitted, however, they should not be particularly limited.

The first inorganic layer 61 may cover the second electrode E2. The first inorganic layer 61 may prevent external moisture or oxygen from entering the light emitting device ELC. For example, the first inorganic layer 61 may include silicon nitride, silicon oxide, or a compound thereof. The first inorganic layer 61 may be formed by a deposition process.

The organic layer 62 may be disposed on the first inorganic layer 61 to make contact with the first inorganic layer 61. The organic layer 62 may provide a flat surface on the first inorganic layer 61. In detail, the organic layer 62 may provide the flat surface in the active area AA1.

An uneven shape formed on the upper surface of the first inorganic layer 61 or particles existing on the first inorganic layer 61 may be covered by the organic layer OL, and thus an influence by a surface state of the upper surface of the first inorganic layer 61 on components formed on the organic layer 62 may be blocked or reduced. In addition, the organic layer 62 may relieve a stress between layers making contact with each other. The organic layer 62 may include an organic material and may be formed by a solution process, such as a spin coating, slit coating, or inkjet process.

The second inorganic layer 63 may be disposed on the organic layer 62 to cover the organic layer 62. The second inorganic layer 63 may be stably formed on a relatively flat surface than being disposed on the first inorganic layer 61. The second inorganic layer 63 may encapsulate the organic layer 62. The second inorganic layer 63 may include silicon nitride, silicon oxide, or a compound thereof. The second inorganic layer 63 may be formed by a deposition process.

The electronic panel 200 may include a thin film transistor TR-D (hereinafter, referred to as a "driving transistor"), a plurality of signal patterns VSS1, E-CNT1, V-INT, and CL, and a plurality of dam portions DM1 and DM2, which are disposed in the peripheral area NAA.

The driving transistor TR-D, the signal patterns VSS1, E-CNT1, V-INT, and CL, and the dam portions DM1 and DM2 may form the display unit 210 (refer to FIG. 2B). Meanwhile, the driving transistor TR-D and some of the signal patterns VSS1, E-CNT1, V-INT, and CL may form a gate driving circuit that applies a gate signal to a gate line GL.

The driving transistor TR-D is shown to have a structure corresponding to the pixel transistor TR. For example, the driving transistor TR-D may include a semiconductor pattern SP disposed on the first insulating layer 10, a control electrode CE disposed on the second insulating layer 20, and an input electrode IE and an output electrode OE, which are disposed on the third insulating layer 30.

Accordingly, the driving transistor TR-D and the pixel transistor TR may be substantially simultaneously formed through the same process. Thus, a manufacturing process may be simplified, and a manufacturing cost may be reduced. However, this is merely exemplary. The driving transistor TR-D according to the exemplary embodiment of the inventive concepts may include electrodes and a semiconductor pattern, which are disposed on a different layer from the pixel transistor TR or may have a different structure from the pixel transistor TR, however, they should not be limited to a particular embodiment.

The signal patterns VSS1, E-CNT1, V-INT, and CL may include a power supply line VSS1, a connection electrode E-CNT1, an initialization voltage line V-INT, and a driving signal line CL. The power supply line VSS1 may correspond to a power terminal VSS of the pixel PX. The power supply line VSS1 applies the second power voltage to the light emitting device ELD.

The power supply line VSS1 may be disposed on the third insulating layer 30. The power supply line VSS1 may be disposed on the same layer as the input electrode IE or the output electrode OE of the driving transistor TR-D. The power supply line VSS1 may be substantially simultaneously pattered with the input electrode IE or the output electrode OE of the driving transistor TR-D through the same process using one mask, however, this is merely exemplary. The power supply line VSS1 may be disposed on a different layer from the input electrode IE or the output electrode OE of the driving transistor TR-D and may be formed through different processes, however, it should not be limited thereto or thereby.

The connection electrode E-CNT1 may be disposed on the fourth insulating layer 40. The connection electrode E-CNT1 may be electrically connected to the power supply line VSS1. The connection electrode E-CNT1 may cover the power supply line VSS1 exposed through the fourth insulating layer 40.

The second electrode E2 of the light emitting device ELD may extend from the active area AA1 and may be connected to the connection electrode E-CNT1. The connection electrode E-CNT1 may receive the second power voltage from the power supply line VSS1. Accordingly, the second power voltage may be applied to the second electrode E2 via the connection electrode E-CNT1, and thus the second power voltage may be commonly applied to each pixel.

The connection electrode E-CNT1 may be disposed on the same layer as the first electrode E1 of the light emitting device ELD, however, this is merely exemplary. The connection electrode E-CNT1 may be disposed on a different layer from the first electrode E1.

The driving signal line CL may be provided in a plural number, and the driving signal lines CL may be disposed on the third insulating layer 30. The driving signal lines CL may be disposed in the peripheral area NAA. The driving signal lines CL may be routing lines connected to pads (not shown) or lines forming an integrated circuit (IC). The driving signal lines CL may be arranged to be spaced apart from each other in the first direction D1 and may independently transmit an electrical signal.

The initialization voltage line V-INT may apply an initialization voltage to the pixel PX. Although not shown in figures, the initialization voltage line V-INT may be provided in a plural number, and the initialization voltage lines V-INT may apply the initialization voltage to the pixels, respectively.

The driving signal lines CL and the initialization voltage line V-INT may be disposed on the same layer and may be substantially simultaneously formed through the same process, however, this is merely exemplary. The driving signal lines CL and the initialization voltage line V-INT may be formed through different processes from each other and should not be limited to a specific embodiment.

The dam portions DM1 and DM2 may be disposed in the peripheral area NAA. The dam portions DM1 and DM2 may prevent the organic layer 62 from overflowing from the active area AA1 toward the outside of the dam portions DM1 and DM2, for example, toward the direction opposite to the first direction D1 in FIG. 2B.

The dam portions DM1 and DM2 may be disposed adjacent to at least one side of the active area AA1. The dam portions DM1 and DM2 may surround the active area AA1 when viewed in a plan view. The dam portions DM1 and DM2 may include a first dam portion DM1 and a second dam portion DM2.

The first dam portion DM1 may be disposed closer to the active area AA1 relative to the second dam portion DM2. The first dam portion DM1 may be disposed to overlap with the power supply line VSS1 when viewed in a plan view. In the present exemplary embodiment, the connection electrode E-CNT1 may pass through between the first dam portion DM1 and the power supply line VSS1 when viewed in a cross section.

In the present exemplary embodiment, the first dam portion DM1 may include the same material as the fifth insulating layer 50 and may be substantially simultaneously formed with the fifth insulating layer 50 using one mask. Therefore, it is not necessary to add a separate process to form the first dam portion DM1, and thus a process cost may be reduced and a process may be simplified.

The second dam portion DM2 may be disposed on an outside relative to the first dam portion DM1. The second dam portion DM2 may be disposed at a position to cover a portion of the power supply line VSS1. In the present exemplary embodiment, the second dam portion DM2 may have a multi-layer structure of a first layer P1, a second layer P2, and a third layer P3.

In the present exemplary embodiment, the connection electrode E-CNT1 may be disposed to partially overlap with the first layer P1 of the second dam portion DM2. An end of the connection electrode E-CNT1 may be inserted into between the first layer P1 and the second layer P2, however, this is merely exemplary. The connection electrode E-CNT1 may not extend to the second dam portion DM2 and should not be limited to a particular embodiment.

The input sensing unit 220 may be disposed on the display unit 210. However, according to another embodiment, the input sensing unit 220 may be disposed under the display unit 210 or may be inserted into the display unit 210, however, it should not be limited to a particular embodiment.

The input sensing unit 220 may include a first sensing insulating layer TIS1, a second sensing insulating layer TIS2, a first sensing conductive pattern MT1, and a second sensing conductive pattern MT2. The first sensing conductive pattern MT1 and the second sensing conductive pattern MT2 may form sensing electrodes that receive voltages opposite to each other to form a capacitance.

The first sensing conductive pattern MT1 and the second sensing conductive pattern MT2 may be disposed on different layers from each other. The first sensing conductive pattern MT1 may be disposed between the first sensing insulating layer TIS1 and the second sensing insulating layer TIS2. The second sensing conductive pattern MT2 may be disposed on the second sensing insulating layer TIS2.

At least one of the first sensing conductive pattern MT1 and the second sensing conductive pattern MT2 may include a plurality of mesh lines. At least a portion of the second sensing conductive pattern MT2 may be connected to the first sensing conductive pattern MT1 after penetrating through the second sensing insulating layer TIS2.

According to the inventive concepts, the electronic panel 200 includes the input sensing unit 220 including the mesh lines, and thus the electronic panel 200 may have improved elasticity. Accordingly, the electronic panel 200 may stably have a shape in which at least a portion of the active area AA1 is curved.

According to another embodiment, at least one of the first sensing conductive pattern MT1 and the second sensing conductive pattern MT2 may include a transparent conductive material. In this case, the first sensing conductive pattern MT1 and the second sensing conductive pattern MT2 may be disposed to overlap with the area in which the light emitting device ELD is disposed when viewed in a plan view. As another way, the first sensing conductive pattern MT1 and the second sensing conductive pattern MT2 may be electrically insulated from each other to form sensing electrodes opposite to each other, respectively. The input sensing unit 220 may sense the external touch by sensing a variation in capacitance between the opposing sensing electrodes or the capacitance between the external touch and the sensing electrodes. The input sensing unit 220 according to the exemplary embodiment of the inventive concepts may include various embodiments and should not be limited to a particular embodiment.

Although not shown in figures, the input sensing unit 220 may further include an anti-reflection layer disposed on the second sensing insulating layer TIS2. The anti-reflection layer may include a polarizing film or a color filter.

Referring to FIG. 2A again, the pressure sensing units 310 and 320 may include a first pressure sensing unit 310 and a second pressure sensing unit 320, which are disposed to face each other. The first pressure sensing unit 310 may be disposed on the first side surface SS1, and the second pressure sensing unit 320 may be disposed on the second side surface SS2. The first pressure sensing unit 310 may be disposed between the first side surface SS1 and the housing unit 400, and the second pressure sensing unit 320 may be disposed between the second side surface SS2 and the housing unit 400.

Each of the first and second pressure sensing units 310 and 320 may sense the pressure applied to the facing surface. For example, as shown in FIG. 1B, the external pressure PS1 applied to the first side surface SS1 may be sensed by the second pressure sensing unit 320. According to the inventive concepts, it is possible to improve an accuracy of pressure sensing by separating the surface to which the pressure is applied from the surface from which the pressure is sensed.

The housing unit 400 may be coupled to the window 100. The housing unit 400 may accommodate the electronic panel 200 and the first and second pressure sensing units 310 and 320.

The housing unit 400 may include a bottom portion BB and a plurality of side portions W1, W2, W3, and W4. The bottom portion BB may be a surface substantially parallel to the first direction D1 and the second direction D2. The side portions W1, W2, W3, and W4 may be bent from the bottom portion BB to the third direction D3. The side portions W1, W2, W3, and W4 may include first, second, third, and fourth side portions W1, W2, W3, and W4.

The first and second side portions W1 and W2 may have a length extending in the second direction D2. The first and second side portions W1 and W2 may be disposed to be respectively parallel to the first and second side surfaces SS1 and SS2. The first and second pressure sensing units 310 and 320 may be respectively disposed between the first side surface SS1 and the first side portion W1 and between the second side surface SS2 and the second side portion W2.

The third and fourth side portions W3 and W4 may have a length extending in the first direction D1. The third and fourth side portions W3 and W4 may have a relatively greater height than the first and second side portions W1 and W2 in the third direction DR3.

FIGS. 3A to 3D are cross-sectional views showing electronic apparatuses EA-a, EA-b, EA-c, and EA-d according to an exemplary embodiment of the inventive concepts. FIGS. 3A to 3D show cross-sections when the external pressure PS1 corresponding to FIG. 1A is applied to each of the electronic apparatuses EA-a, EA-b, EA-c, and EA-d. Hereinafter, the inventive concepts will be described with reference to FIGS. 3A to 3D. In FIGS. 3A to 3D, the same reference numerals denote the same elements in FIGS. 1A to 2B, and thus detailed descriptions of the same elements will be omitted.

Figure 3A:
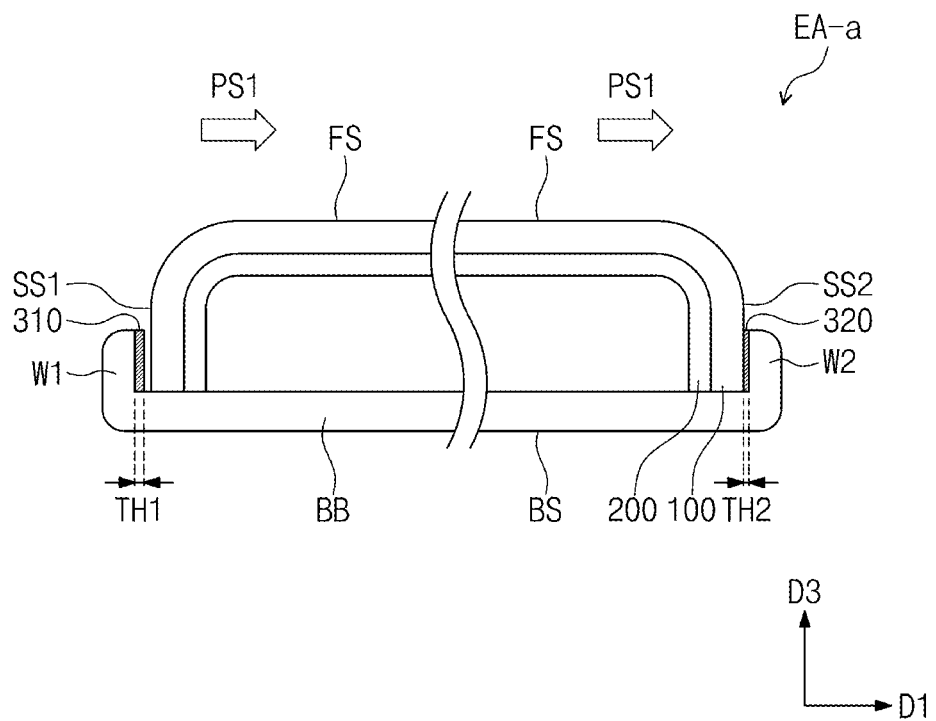
FIGS. 3A, 3B, 3C, and 3D are cross-sectional views showing electronic apparatuses according to an exemplary embodiment of the inventive concepts.

Referring to FIG. 3A, in the electronic apparatus EA-a, each of the pressure sensing units 310 and 320 may be coupled to the housing unit and may be separated from the window 100. The first pressure sensing unit 310 may be coupled to the first side portion W1, and the second pressure sensing unit 320 may be coupled to the second side portion W2. In the present exemplary embodiment, the window 100 and the electronic panel 200 may move in the housing unit by the external pressure PS1. The window 100 and the electronic panel 200 may move in the first direction D1 by the external pressure PS1.

The external pressure PS1 may be transmitted to the second pressure sensing unit 320 among the first and second pressure sensing units 310 and 320 to change a thickness TH2 of the second pressure sensing unit 320. The thickness TH2 of the second pressure sensing unit 320 may become smaller than a thickness TH1 of the first pressure sensing unit 310 by the external pressure PS1.

Figure 3B:
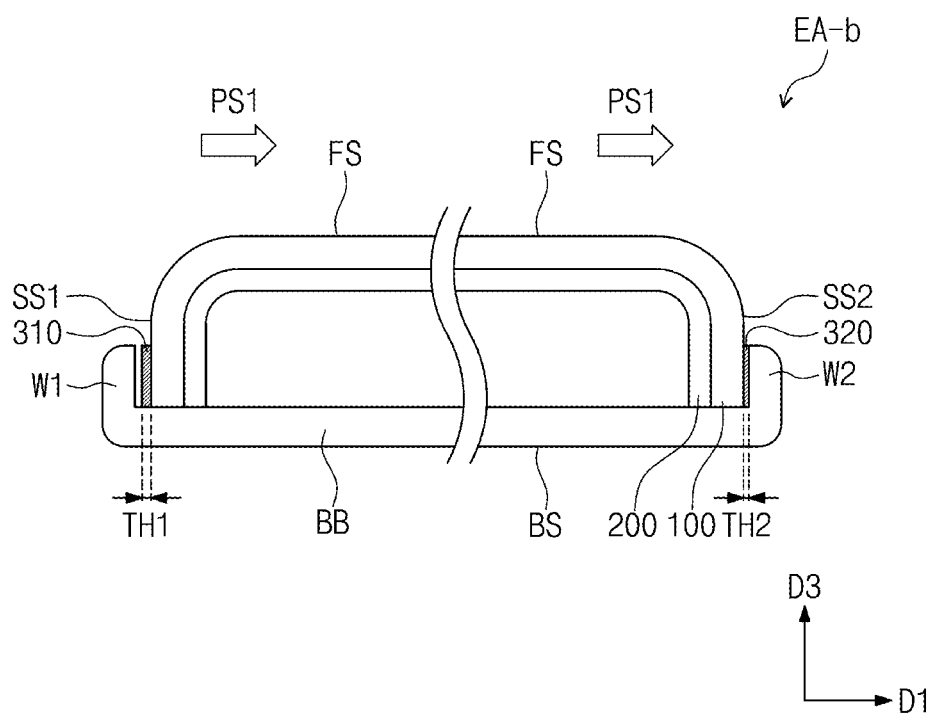

Referring to FIG. 3B, in the electronic apparatus EA-b, each of the pressure sensing units 310 and 320 may be coupled to the window 100 and may be separated from the housing unit. The first pressure sensing unit 310 may be coupled to the first side surface SS1, and the second pressure sensing unit 320 may be coupled to the second side surface SS2. Similar to that shown in FIG. 3A, the external pressure PS1 applied to the first side surface SS1 may change the thickness of the second pressure sensing unit 320. The second pressure sensing unit 320 may sense the external pressure PS1 based on the change in thickness thereof.

Figure 3C:
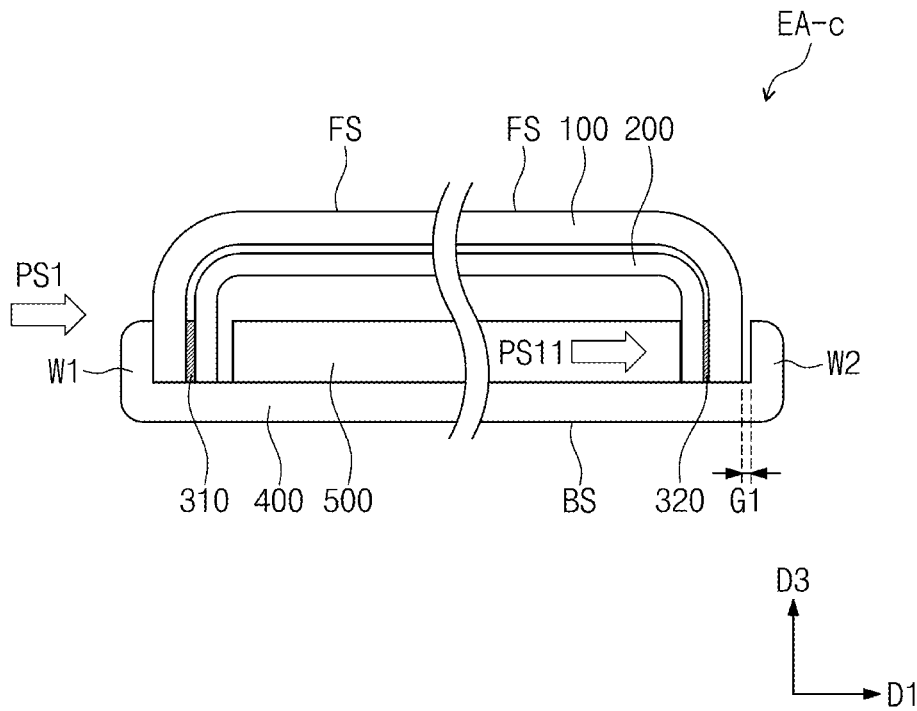

Referring to FIG. 3C, in the electronic apparatus EA-c, the pressure sensing units 310 and 320 may be disposed between the electronic panel 200 and the window 100. The pressure sensing units 310 and 320 may be attached to or inserted into the electronic panel 200. Meanwhile, the electronic apparatus EA-c according to the present exemplary embodiment may further include a support member 500. The support member 500 may support the bent shape of the electronic panel 200. When the external pressure PS1 is applied, the support member 500 may apply a pressure P511 corresponding to the external pressure PS1 to the electronic panel 200. The thickness of the second pressure sensing unit 320 may be changed by the pressure P511 corresponding to the external pressure PS1, and thus the second pressure sensing unit 320 may sense the external pressure PS1.

Figure 3D:
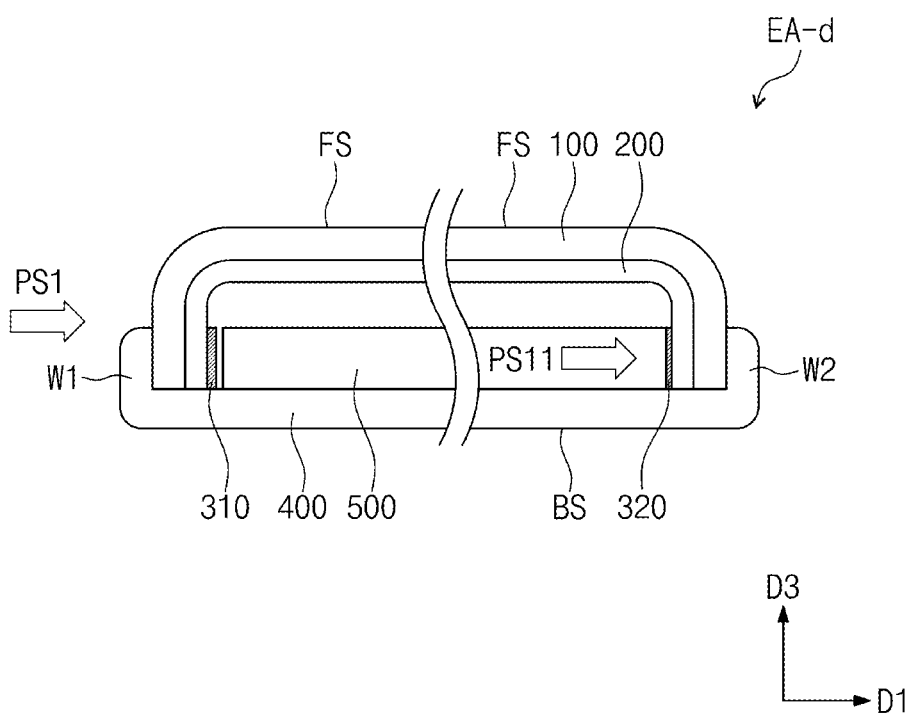

Referring to FIG. 3D, in the electronic apparatus EA-d, the pressure sensing units 310 and 320 may be disposed between the electronic panel 200 and the support member 500. The pressure sensing units 310 and 320 may be attached to a rear surface of the electronic panel 200 or may be inserted into the electronic panel 200. When the external pressure PS1 is applied, the support member 500 may apply a pressure P511 corresponding to the external pressure PS1 to the second pressure sensing unit 320 among the first and second pressure sensing units 310 and 320. The second pressure sensing unit 320 is disposed on the opposite side of the first pressure sensing unit 310 where the external pressure PS1 is applied. The thickness of the second pressure sensing unit 320 may be changed by the pressure P511 corresponding to the external pressure PS1, and thus the second pressure sensing unit 320 may sense the external pressure PS1.

According to the inventive concepts, the electronic apparatuses EA-a, EA-b, EA-c, EA-d may sense the pressure from the surface opposite to the surface to which the external pressure PS1 is applied. Thus, the electronic apparatuses EA-a, EA-b, EA-c, EA-d may have improved sensitivity with respect to the pressure sensing.

Figure 4A:
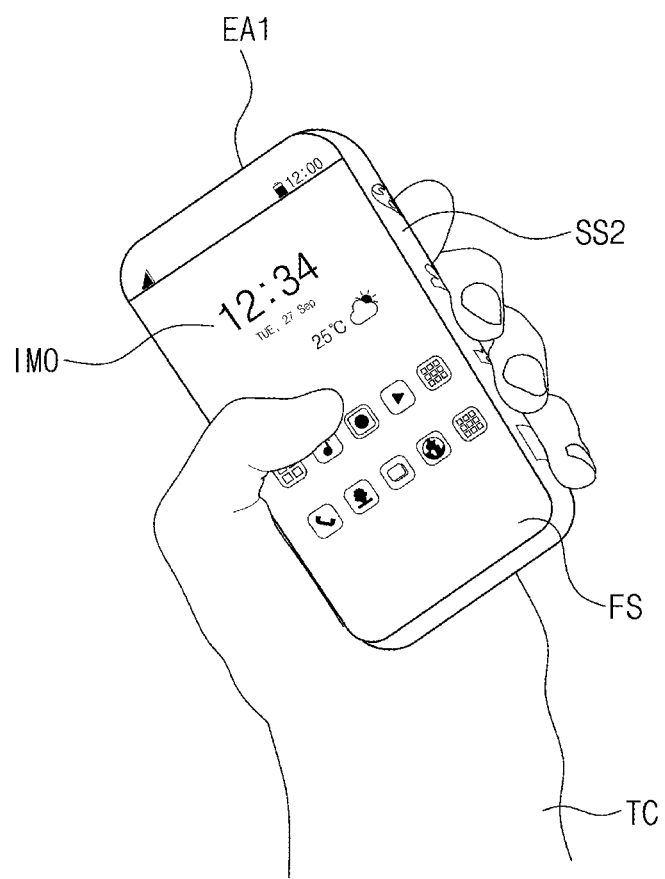
FIG. 4A is a perspective view showing an electronic apparatus according to an exemplary embodiment of the inventive concepts.
Figure 4B:
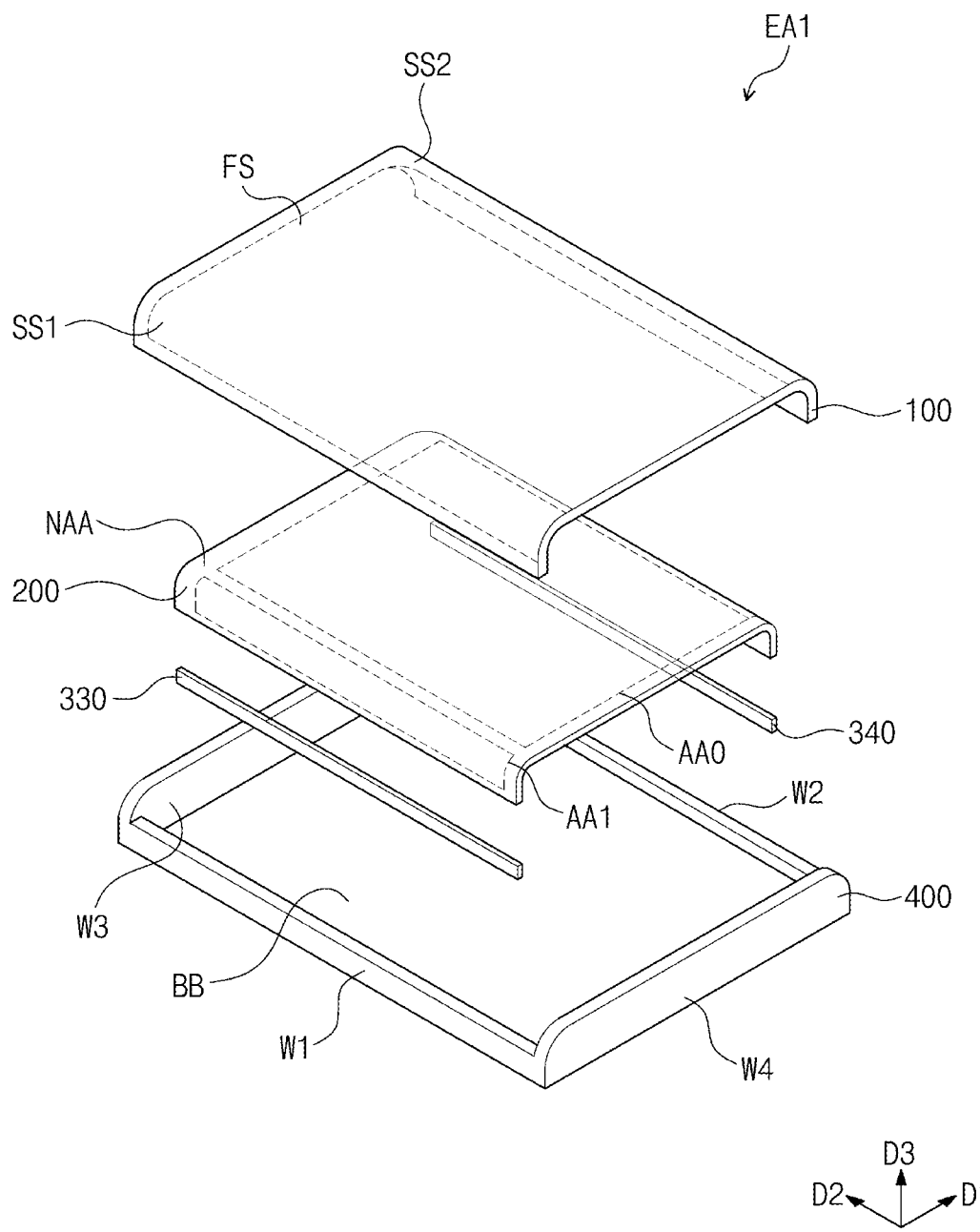
FIG. 4B is an exploded perspective view showing the electronic apparatus shown in FIG. 4A.
Figure 4C:
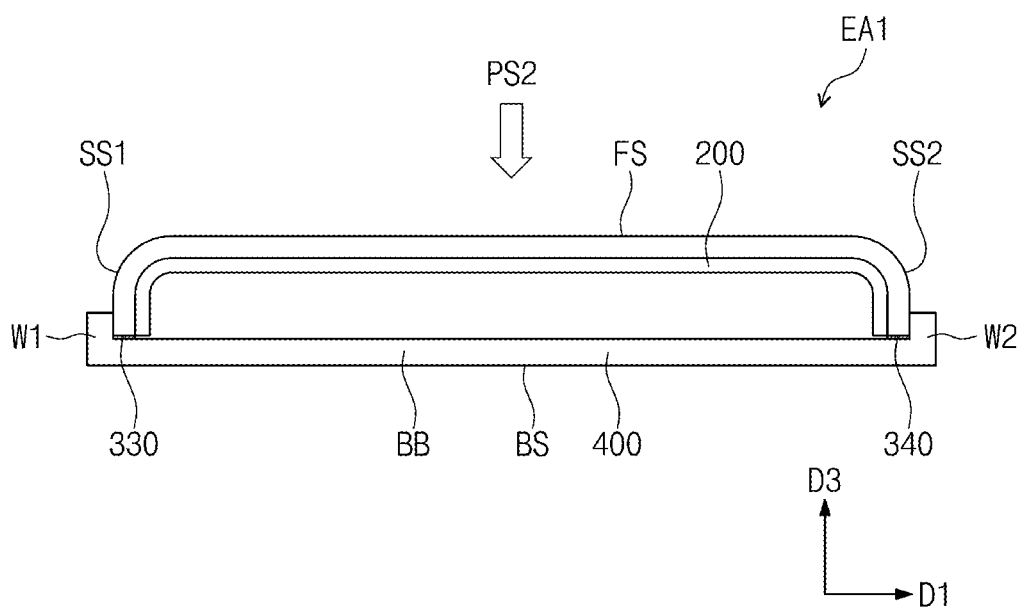
FIG. 4C is a cross-sectional view showing the electronic apparatus shown in FIG. 1A.
Figure 4D:
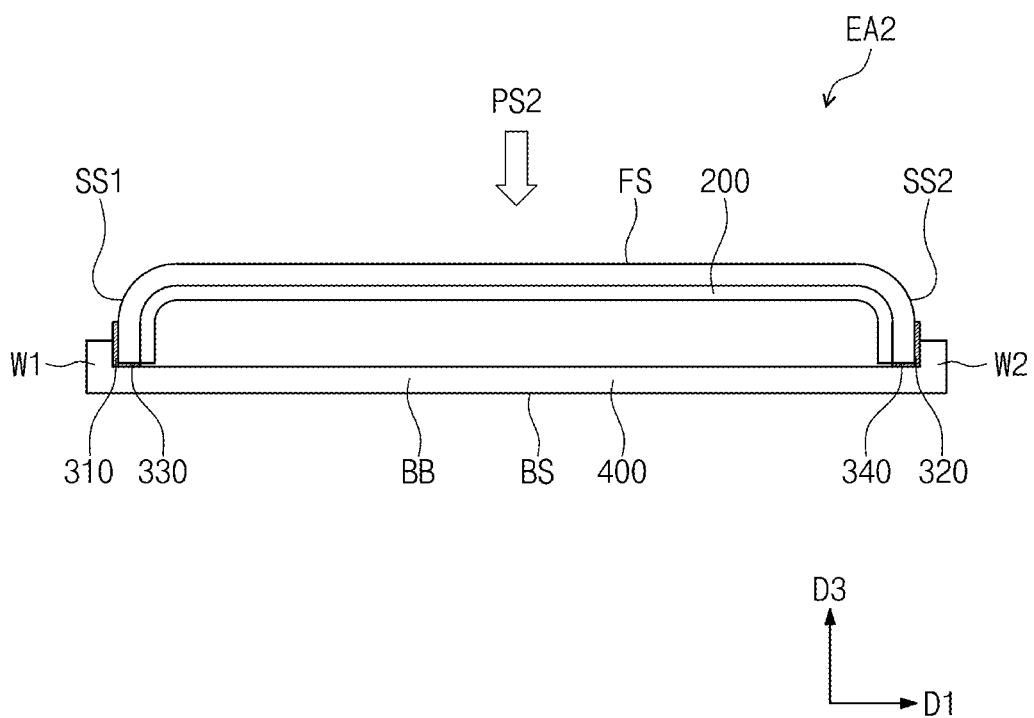
FIG. 4D is a cross-sectional view showing an electronic apparatus according to an exemplary embodiment of the inventive concepts.

FIG. 4A is a perspective view showing an electronic apparatus EA1 according to an exemplary embodiment of the inventive concepts. FIG. 4B is an exploded perspective view showing the electronic apparatus EA1 shown in FIG. 4A. FIG. 4C is a cross-sectional view showing the electronic apparatus EA1 shown in FIG. 4A. FIG. 4D is a cross-sectional view showing an electronic apparatus EA2 according to an exemplary embodiment of the inventive concepts. Hereinafter, the inventive concepts will be described with reference to FIGS. 4A to 4D. Referring to FIG. 4A, the electronic apparatus EA1 may display an image IM0 on front surface FS and sense an external pressure PS2 applied to a front surface FS thereof. In this case, the electronic apparatus EA1 may sense the presence and intensity of the external pressure PS2 at a rear surface BS thereof.

In detail, as shown in FIGS. 4B and 4C, the electronic apparatus EA1 may include third and fourth pressure sensing units 330 and 340. The third and fourth pressure sensing units 330 and 340 may be disposed between the housing unit 400 and the window 100, and in detail, may be disposed between the window 100 and the bottom portion BB, however, this is merely exemplary. The third and fourth pressure sensing units 330 and 340 may be disposed between the curved side surfaces of the electronic panel 200 and the bottom portion BB, however, they should not be limited thereto or thereby.

Due to the external pressure PS2 applied to the front surface FS, a thickness of the third and fourth pressure sensing units 330 and 340 may be changed. The electronic apparatus EA1 may sense the external pressure PS2 applied to the front surface FS based on the change in thickness of the third and fourth pressure sensing units 330 and 340. Meanwhile, it may be determined whether the position at which the external pressure PS2 is applied is closer to the first side surface SS1 or the second side surface SS2 based on the difference in the thicknesses of the third and fourth pressure sensing units 330 and 340.

Referring to FIG. 4D, the electronic apparatus EA2 may further include the first and second pressure sensing units 310 and 320 shown in FIG. 1B. The electronic apparatus EA2 may easily sense the external pressure applied to any of the front surface FS, the first side surface SS1, and the second side surface SS2. According to the inventive concepts, the electronic apparatus capable of easily sensing the external pressure applied to various positions according to the arrangement position of the pressure sensing units 310, 320, 330, and 340 may be provided, however, it should not be limited to a particular embodiment.

Figure 5A:
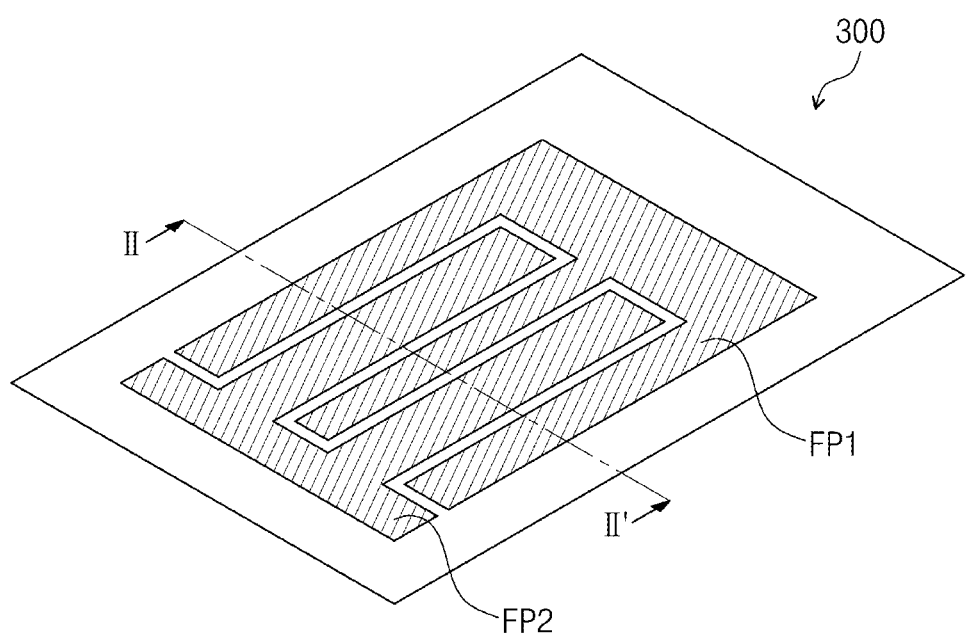
FIG. 5A is a perspective view showing a pressure sensing unit according to an exemplary embodiment of the inventive concepts.
Figure 5B:
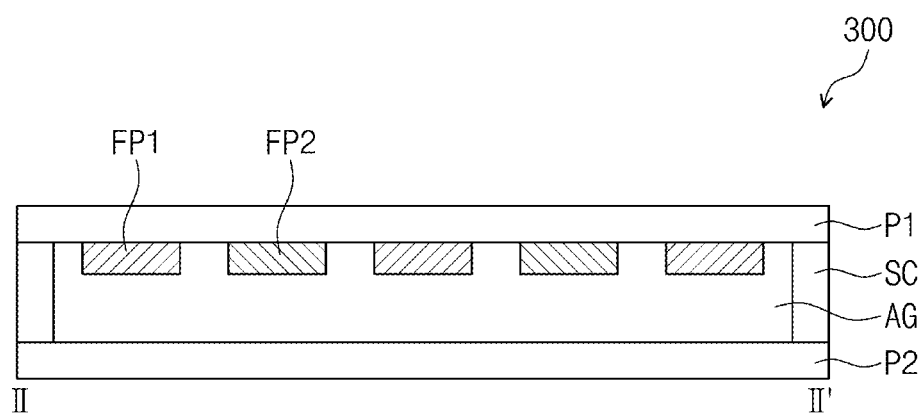
FIGS. 5B and 5C are cross-sectional views taken along a line II-IF shown in FIG. 5A.
Figure 5C:
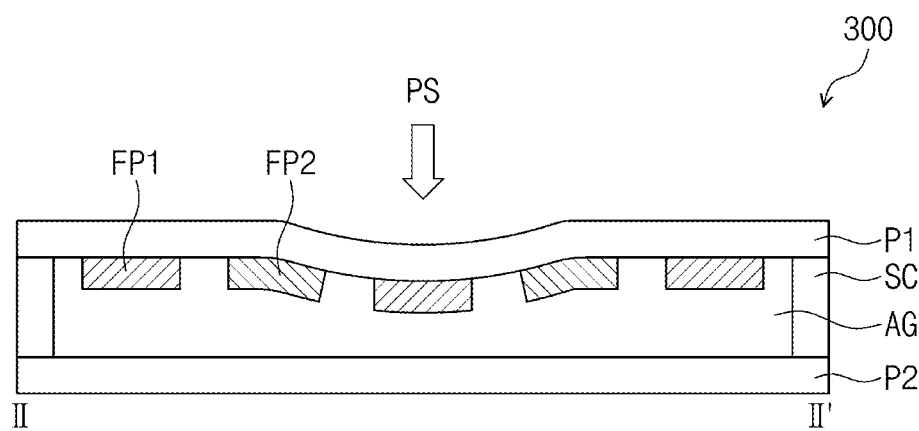

FIG. 5A is a perspective view showing a pressure sensing unit 300 according to an exemplary embodiment of the inventive concepts. FIGS. 5B and 5C are cross-sectional views taken along a line II-IF shown in FIG. 5A. For the convenience of explanation, FIG. 5B shows the cross-section of the pressure sensing unit 300 before the external pressure PS is applied, and FIG. 5C shows the cross-section of the pressure sensing unit 300 after the external pressure PS is applied. Hereinafter, the inventive concepts will be described with reference to FIGS. 5A to 5C. In FIGS. 5A to 5C, the same reference numerals denote the same elements in FIGS. 1A to 4B, and thus detailed descriptions of the same elements will be omitted.

The pressure sensing unit 300 may include a first pattern FP1, a second pattern FP2, a first panel P1, a second panel P2, and a supporter SC. The first pattern FP1 and the second pattern FP2 may have a conductivity. The first pattern FP1 and the second pattern FP2 may have different electric potentials from each other. The first pattern FP1 and the second pattern FP2 may be provided in a shape in which the first and second patterns FP1 and FP2 are engaged with each other when viewed in a plan view. The first pattern FP1 and the second pattern FP2 may not overlap with each other and may be disposed to be spaced apart from each other when viewed in a plan view.

The first panel P1 and the second panel P2 may face each other in the third direction D3. The supporter SC may be disposed between the first panel P1 and the second panel P2 and may support the first panel P1 and the second panel P2 so that the first panel P1 and the second panel P2 are spaced apart from each other by a predetermined gap AG.

The first pattern FP1 and the second pattern FP2 may be disposed on the first panel P1. The first panel P1 and the second panel P2 may have a flexibility. The external pressure PS is applied to the first panel P1. When a shape of the first panel P1 is deformed by the external pressure PS, a distance between the first pattern FP1 and the second pattern FP2 may be changed. The pressure sensing unit 300 may sense the external pressure PS based on a variation in capacitance between the first pattern FP1 and the second pattern FP2.

In the pressure sensing unit 300 according to an exemplary embodiment of the inventive concepts, the first pattern FP1 and the second pattern FP2 may serve as a strain gauge. In this case, when the shape of the first and second patterns FP1 and FP2 is deformed by the external pressure PS, the pressure sensing unit 300 may sense the external pressure PS based on a variation in resistance of the first pattern FP1 and the second pattern FP2. The pressure sensing unit 300 according to the exemplary embodiment of the inventive concepts may be driven in various manners, and it should not be limited to a particular embodiment.

Figure 6A:
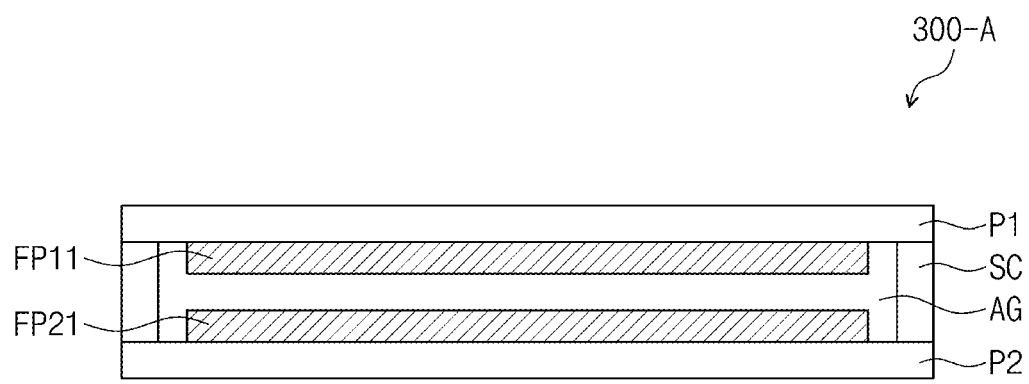
FIGS. 6A and 6B are cross-sectional views showing a pressure sensing unit according to an exemplary embodiment of the inventive concepts.
Figure 6B:
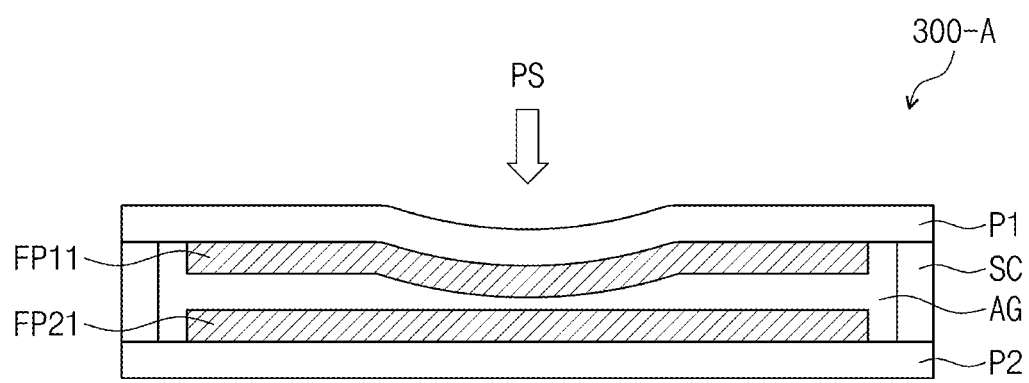

FIGS. 6A and 6B are cross-sectional views showing a pressure sensing unit 300-A according to an exemplary embodiment of the inventive concepts. FIG. 6A shows a cross-section corresponding to FIG. 5B, and FIG. 6B shows a cross-section corresponding to FIG. 5C. Hereinafter, the inventive concepts will be described with reference to FIGS. 6A and 6B.

The pressure sensing unit 300-A may include a first pattern FP11 and a second pattern FP21, which are disposed on different panels from each other. The first pattern FP11 may be disposed on a first panel P1, and the second pattern FP21 may be disposed on a second panel P2. In the present exemplary embodiment, the first pattern FP11 and the second pattern FP21 may be disposed to face each other and may overlap with each other when viewed in a plan view.

When an external pressure PS is applied to the first panel P1, a shape of the first panel P1 may be deformed, and thus a distance between the first pattern FP11 and the second pattern FP21 may decrease. The pressure sensing unit 300-A may sense the external pressure PS based on a variation in capacitance between the first pattern FP11 and the second pattern FP21.

Figure 7A:
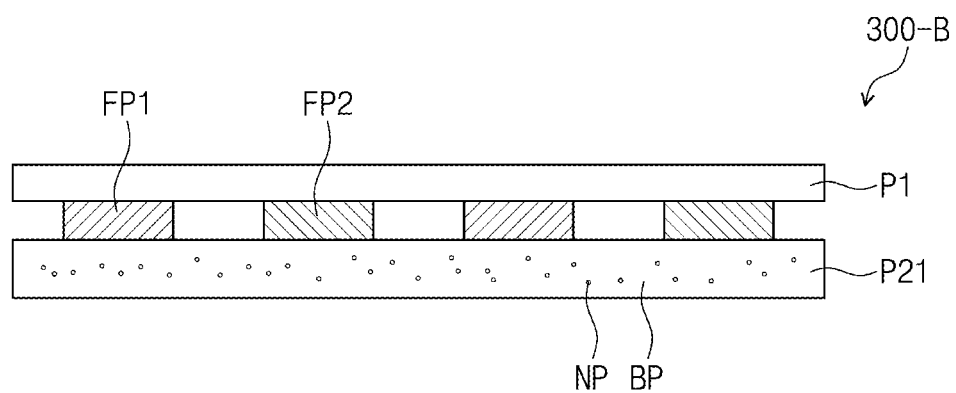
FIGS. 7A and 7B are cross-sectional views showing a pressure sensing unit according to an exemplary embodiment of the inventive concepts.
Figure 7B:
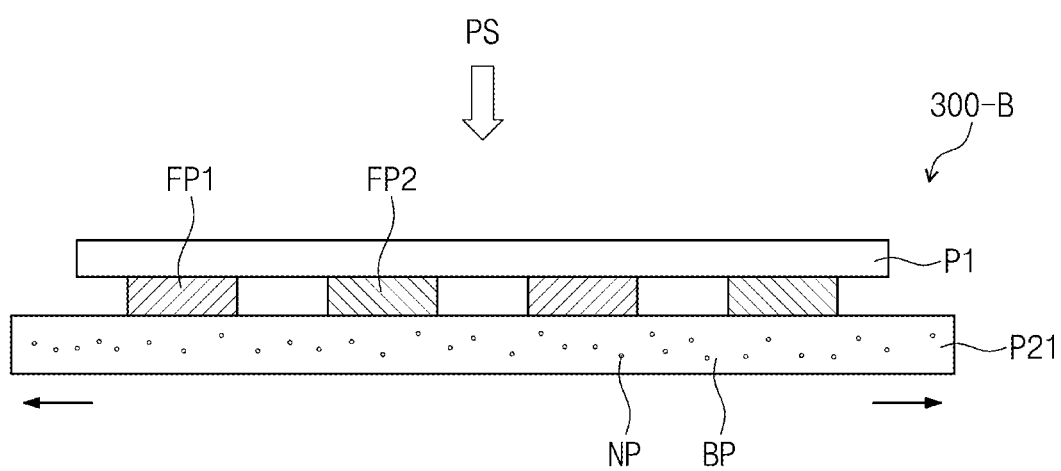

FIGS. 7A and 7B are cross-sectional views showing a pressure sensing unit 300-B according to an exemplary embodiment of the inventive concepts. FIG. 7A shows a cross-section corresponding to FIG. 5B, and FIG. 7B shows a cross-section corresponding to FIG. 5C. Hereinafter, the inventive concepts will be described with reference to FIGS. 6A and 6B.

The pressure sensing unit 300-B may include a second panel P21 including a base panel BP and a plurality of nano-particles NP. The base panel BP may include an insulating material having the flexibility, for example, an elastomer binder resin. Each of the nano-particles NP may have the conductivity.

Each of the first pattern FP1 and the second pattern FP2 may be coupled to the first panel P1 and the second panel P21. When the external pressure PS is applied to the first panel P1, the base panel BP may be expanded along an arrow direction by the first pattern FP1 and the second pattern FP2. Accordingly, a distance between the nano-particles increases, and a resistance of the second panel P21 may vary.

For example, as the distance between the nano-particles decreases, a probability of electron tunneling in the second panel P21 increases, and the resistance of the second panel P21 may decrease. The pressure sensing unit 300-B may sense the external pressure PS based on the variation in resistance of the second panel P21.

Figure 8A:
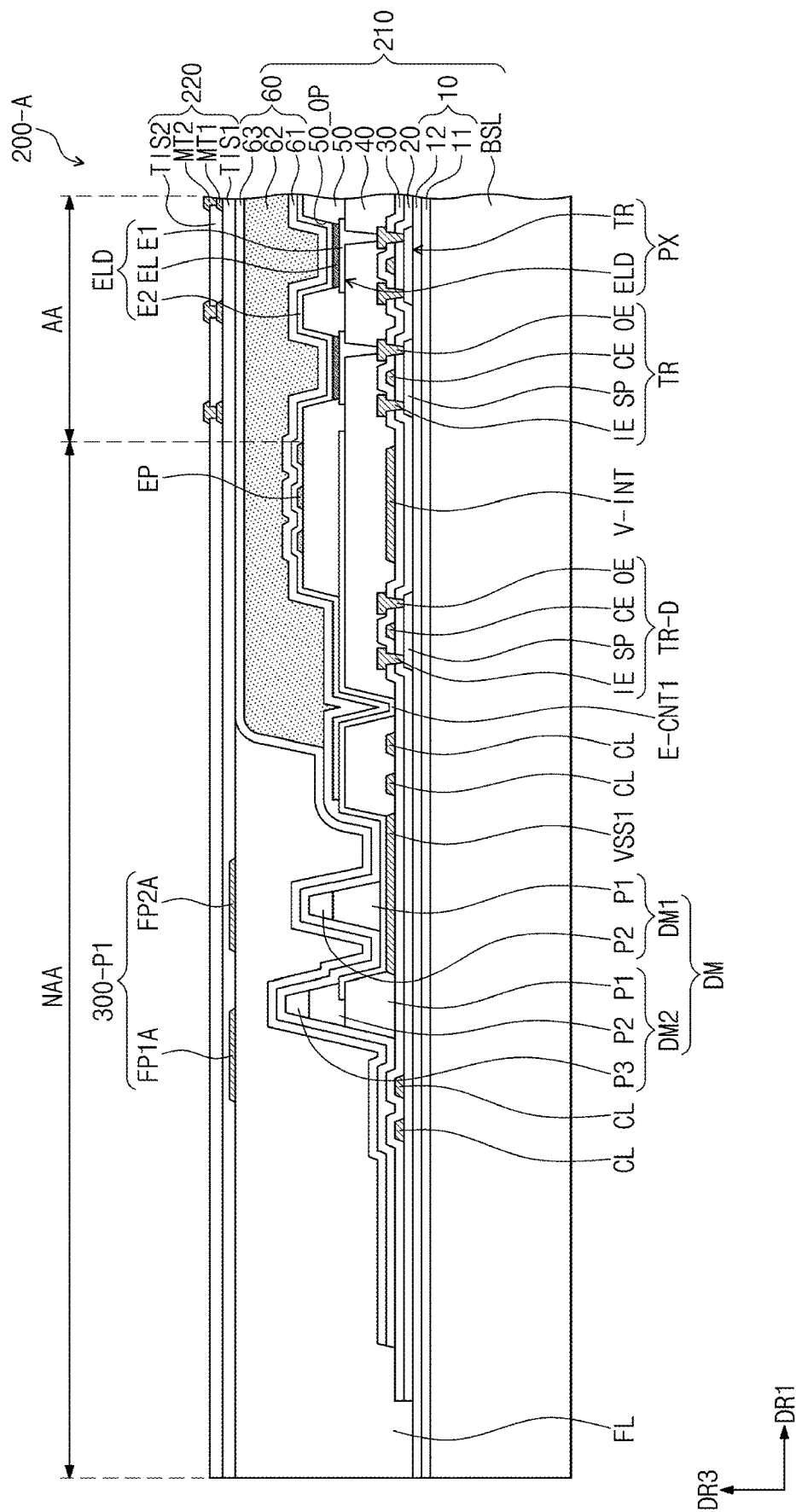
FIGS. 8A, 8B, and 8C are cross-sectional views showing electronic panels according to an exemplary embodiment of the inventive concepts.
Figure 8B:
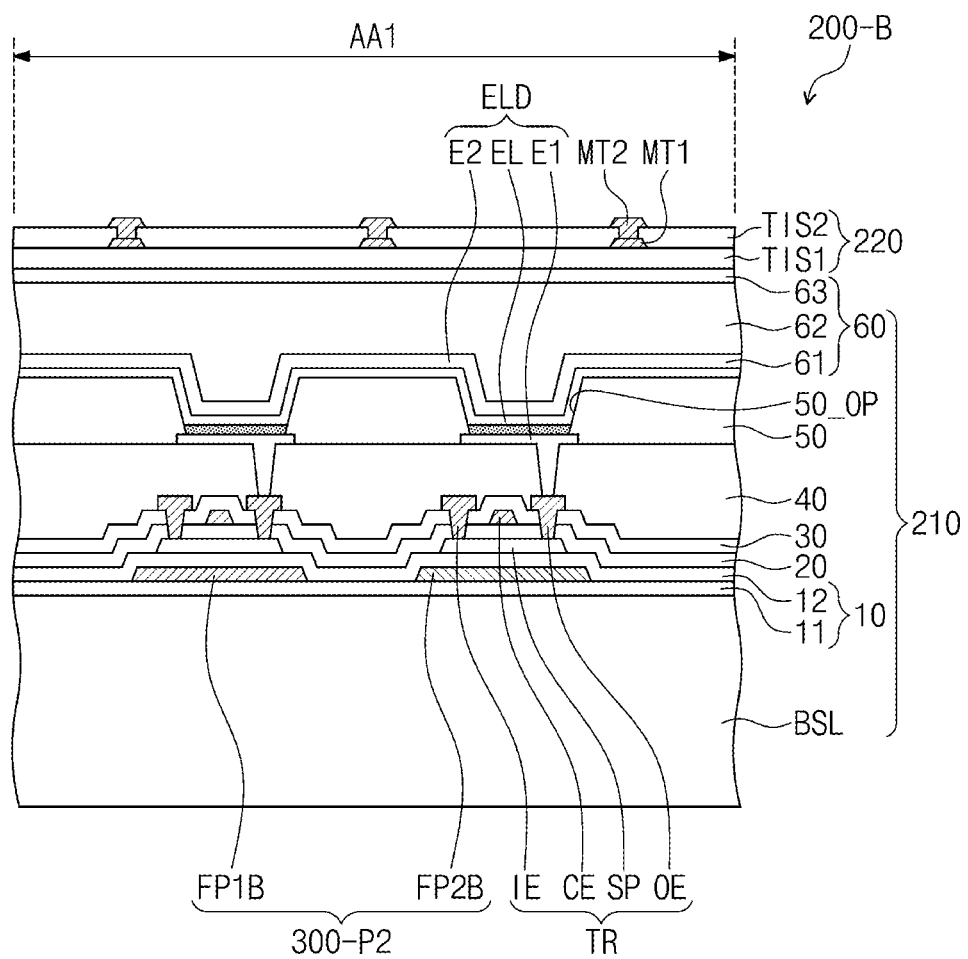
Figure 8C:
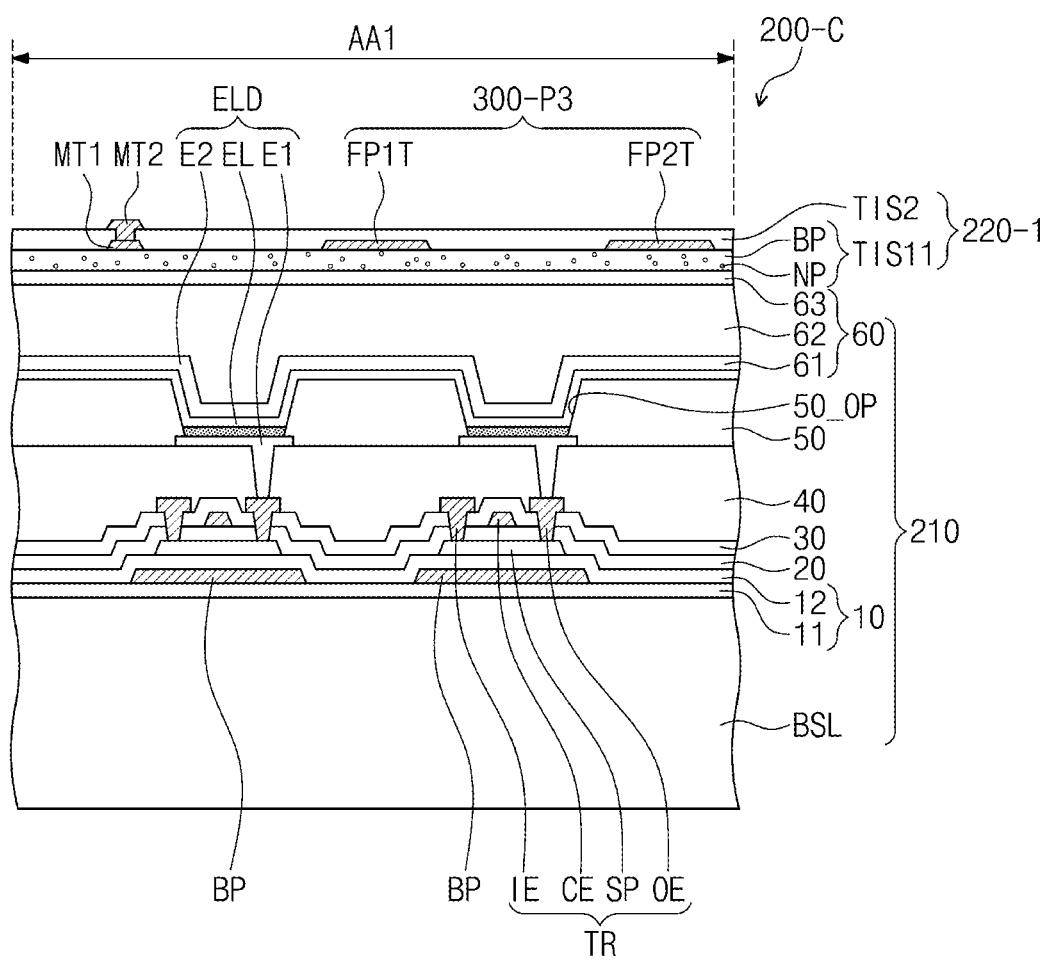

FIGS. 8A to 8C are cross-sectional views showing electronic panels 200-A, 200-B, and 200-C according to an exemplary embodiment of the inventive concepts. FIG. 8A shows an area of the electronic panel 200-A, which corresponds to FIG. 2B, and FIGS. 8B and 8C show cross-sections in an active area AA1 of the electronic panels 200-B and 200-C. Hereinafter, the inventive concepts will be described with reference to FIGS. 8A to 8C.

Referring to FIGS. 8A to 8C, pressure sensing units 300-P1, 300-P2, and 300-P3 may be inserted into the electronic panels 200-A, 200-B, and 200-C, respectively.

For example, as shown in FIG. 8A, the pressure sensing unit 300-P1 may be disposed between the input sensing unit 220 and the display unit 210. In the present exemplary embodiment, first and second patterns FP1A and FP2A forming the pressure sensing unit 300-P1 may be disposed on an additional layer FL.

In a case where the additional layer FL includes an organic material with flexibility, the additional layer FL may be deformed due to the external pressure. The first and second patterns FP1A and FP2A may sense the external pressure based on a variation in capacitance, which is caused by the deformation of the additional layer FL.

Alternately, the additional layer FL may further include a plurality of conductive nano-particles distributed therein. In this case, when the additional layer FL is deformed by the first and second patterns FP1A and FP2A, a distance between the nano-particles varies. The pressure sensing unit 300-P1 may sense the external pressure by sensing the variation in resistance of the additional layer FL.

The pressure sensing unit 300-P1 may be disposed in the peripheral area NAA. According to the inventive concepts, as the pressure sensing unit 300-P1 is disposed in the peripheral area NAA, a pressure sensing area and a touch sensing area may be separated from each other. Accordingly, the external pressure applied to the peripheral area NAA may be easily sensed.

As shown in FIG. 8B, the pressure sensing unit 300-P2 may be disposed in a display unit 210. The pressure sensing unit 300-P2 may be disposed in the active area AA1. First and second patterns FP1B and FP2B forming the pressure sensing unit 300-P2 may be disposed between a base substrate BSL and a first insulating layer 10.

The first and second patterns FP1B and FP2B may be disposed to overlap with a thin film transistor TR when viewed in a plan view. In the present exemplary embodiment, the first and second patterns FP1B and FP2B are shown as being arranged at positions overlapping with a semiconductor pattern SP and a control electrode CE when viewed in a plan view. According to the inventive concepts, the pressure sensing unit 300-P2 may be formed during the process of forming the thin film transistor TR, and thus the process may be simplified and the process cost may be reduced.

As shown in FIG. 8C, the pressure sensing unit 300-P3 may be disposed in an input sensing unit 220-1. The pressure sensing unit 300-P3 may be disposed on the display unit 210. First and second patterns FP1T and FP2T forming the pressure sensing unit 300-P3 may be disposed in an active area AA1 unlike the pressure sensing unit 300-P1 shown in FIG. 8A.

The first and second patterns FP1T and FP2T may be disposed on the same layer as the first sensing conductive pattern MT1. In this case, a first sensing insulating layer TIS11 may include a base panel BP and a plurality of nano-particles NP. The first sensing insulating layer TIS11 according to the present exemplary embodiment may substantially correspond to the second panel P21 shown in FIG. 7B. According to the inventive concepts, sensing conductive patterns MT1 and MT2 composed of the sensing electrodes used to sense the touch and the patterns FP1T and FP2T used to sense the pressure may be substantially simultaneously formed. Thus, the process may be simplified, and the process cost may be reduced.

As shown in FIG. 8C, the display unit 210 may further include a light blocking pattern BP. The first and second patterns FP1B and FP2B shown in FIG. 8B may be disposed on substantially the same layer as the light blocking pattern BP. In the present exemplary embodiment, the light blocking pattern BP may include a conductive material. For example, the light blocking pattern BP may include at least one of a metal, an alloy, a conductive oxide, and a conductive polymer. The light blocking pattern BP may block an external light incident into the semiconductor pattern SP from the base substrate BSL or may form a channel in the semiconductor pattern SP with the control electrode CE. The electronic panel 200-C according to the exemplary embodiment of the inventive concepts may be implemented in various embodiments, and it should not be limited to a particular embodiment.

As shown in FIGS. 8A to 8C, the electronic panels 200-A, 200-B, and 200-C according to the exemplary embodiment of the inventive concepts may include the pressure sensing units 300-P1, 300-P2, and 300-P3, respectively. The pressure sensing units 300-P1, 300-P2, and 300-P3 may be disposed at various positions in the electronic panels 200-A, 200-B, and 200-C. Accordingly, the process of forming the pressure sensing units 300-P1, 300-P2, and 300-P3 may be simplified, and the process cost may be reduced.

Figure 9A:
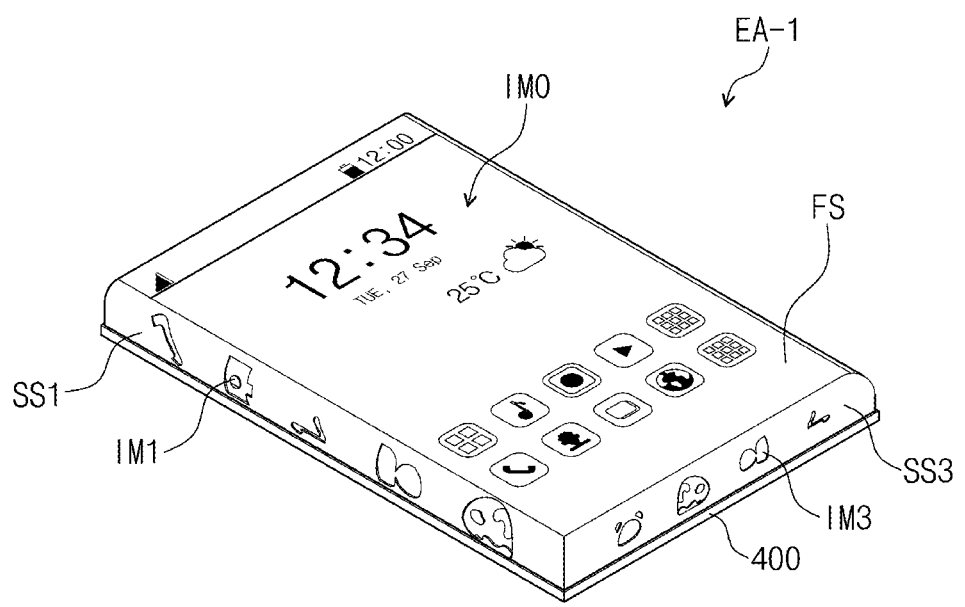
FIG. 9A is a perspective view showing an electronic apparatus according to an exemplary embodiment of the inventive concepts.
Figure 9B:
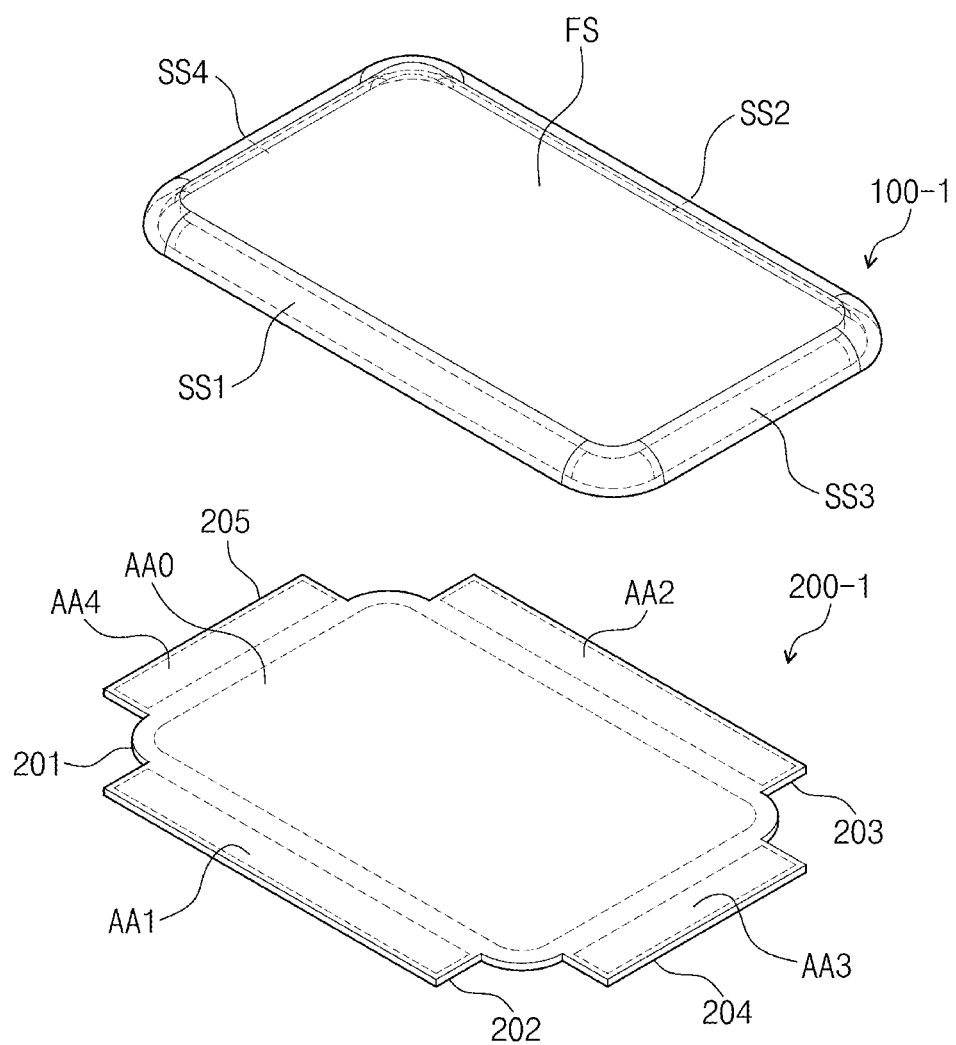
FIG. 9B is an exploded perspective view showing the electronic apparatus shown in FIG. 9A.

FIG. 9A is a perspective view showing an electronic apparatus EA-1 according to an exemplary embodiment of the inventive concepts. FIG. 9B is an exploded perspective view showing the electronic apparatus EA-1 shown in FIG. 9A. For the convenience of explanation, some components of the electronic apparatus EA-1 are omitted in FIG. 9B.

Referring to FIGS. 9A and 9B, the electronic apparatus EA-1 may display an image IM0, IM1, IM3 through a front surface FS and first, second, third, and fourth side surfaces SS1, SS2, SS3, and SS4. The electronic apparatus EA-1 may include a window 100-1 and an electronic panel 200-1. The image displayed on each of the second surface SS2 and the fourth surface SS4 are not shown in FIG. 9A.

The electronic panel 200-1 may include a main portion 201 and a plurality of cut portions 202, 203, 204, and 205. The main portion 201 may be disposed parallel to the front surface FS and may have a quadrangular shape corresponding to the front surface FS. The main portion 201 may include a main active area AA0 to provide the image IM0 to the front surface FS.

The cut portions 202, 203, 204, and 205 may include first, second, third, and fourth cut portions 202, 203, 204, and 205. The first, second, third, and fourth cut portions 202, 203, 204, and 205 may be disposed at sides of the main portion 201 and may protrude from the main portion 201. In FIG. 9B, for the convenience of explanation, the first, second, third, and fourth cut portions 202, 203, 204, and 205 are shown to be parallel to the main portion 201, however, the first, second, third, and fourth cut portions 202, 203, 204, and 205 may be assembled after being bent from the main portion 201 toward the first, second, third, and fourth side surfaces SS1, SS2, SS3, and SS4, respectively. The first, second, third, and fourth cut portions 202, 203, 204, and 205 may include sub-active areas AA1, AA2, AA3, and AA4 to provide images IM0, IM1 and IM3 to the first, second, third, and fourth side surfaces SS1, SS2, SS3, and SS4.

In the electronic apparatus EA-1 according to the present exemplary embodiment, a surface to which the pressure is applied may be separated from a surface from which the pressure is sensed. For example, the pressure applied to the first side surface SS1 of the electronic apparatus EA-1 may be sensed by a pressure sensing unit disposed on the second side surface SS2. The pressure applied to the third side surface SS3 of the electronic apparatus EA-1 may be sensed by a pressure sensing unit disposed on the fourth side surface SS4. According to the inventive concepts, since the pressure is sensed by the pressure sensing unit disposed on the surface facing the surface to which the pressure is applied, the electronic apparatus EA-1 may have more improved sensitivity with respect to the pressure sensing.

According to the inventive concepts, since the pressure sensing units may be respectively disposed on the first, second, third, and fourth side surfaces SS1, SS2, SS3, and SS4, the external pressure applied to the first, second, third, and fourth side surfaces SS1, SS2, SS3, and SS4 may be easily sensed.

Although not shown in figures, the pressure sensing units may be inserted into the electronic panel 200-1 and may be disposed in the active areas AA0, AA1, AA2, AA3, and AA4 or the peripheral area NAA depending on its design, however, they should not be limited to a particular embodiment.

Figure 10A:
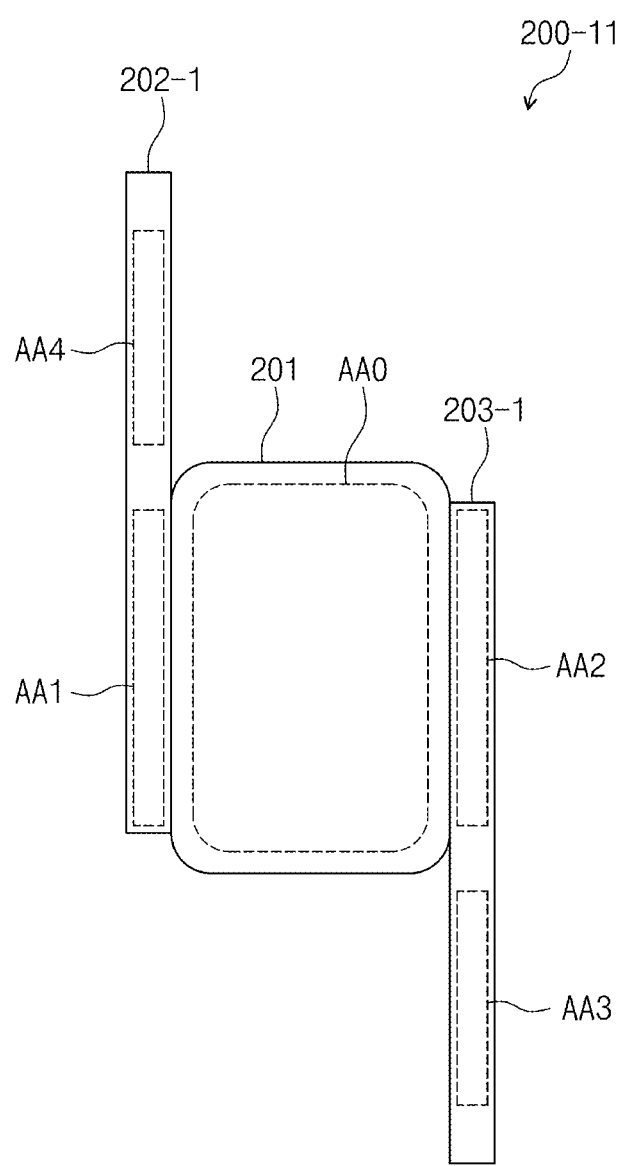
FIG. 10A is a plan view showing an electronic panel according to an exemplary embodiment of the inventive concepts.
Figure 10B:
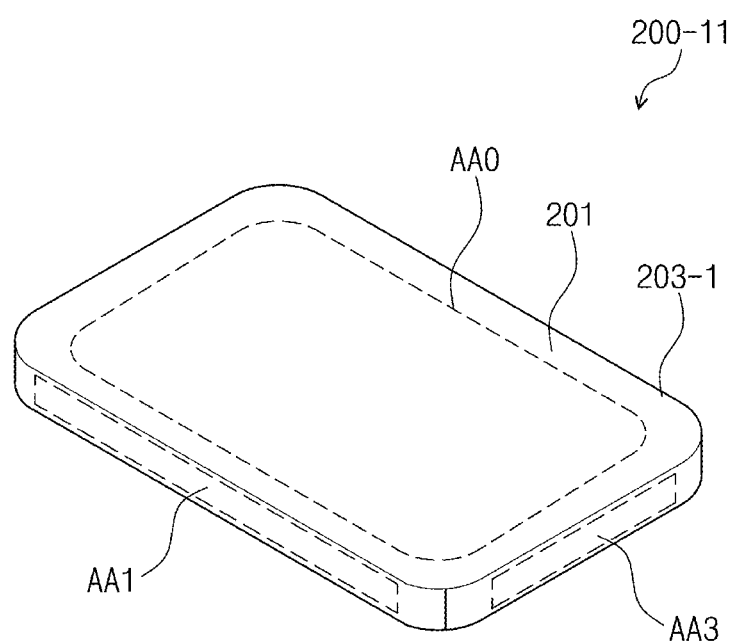
FIG. 10B is a perspective view showing the electronic panel shown in FIG. 10A.

FIG. 10A is a planar view showing an electronic panel 200-11 according to an exemplary embodiment of the inventive concepts. FIG. 10B is a perspective view showing the electronic panel 200-11 shown in FIG. 10A. Hereinafter, the inventive concepts will be described with reference to FIGS. 10A and 10B.

Referring to FIG. 10A, the electronic panel 200-11 may include a main portion 201, a first cut portion 202-1, and a second cut portion 203-1. The main portion 201 may substantially correspond to the main portion 201 shown in FIG. 9A. The electronic panel 200-11 shown in FIG. 10B may have a shape corresponding to the shape of the electronic panel 200-1 in the assembled state as shown in FIG. 9A is assembled.

The first cut portion 202-1 may be disposed at one side of the main portion 201. The first cut portion 202-1 may include a plurality of active areas A1 and A4. The active areas A1 and A4 may be areas that respectively provide images to first and fourth side surfaces SS1 and SS4 (refer to FIG. 9B) of the window.

The second cut portion 203-1 may be disposed at another side of the main portion 201. The second cut portion 203-1 may be disposed at the side opposite to the first cut portion 202-1. The second cut portion 203-1 may include a plurality of active areas A2 and A3. The active areas A21 and A31 may be areas that respectively provide images to second and third side surfaces SS2 and SS3 (refer to FIG. 9B) of the window.

The electronic panel 200-11 may have various shapes as long as the electronic panel 200-11 provide active areas AA0, AA1, AA2, AA3, and AA4 to a front surface FS (refer to FIG. 9B) and the side surfaces SS1, SS2, SS3, and SS4.

Figure 11A:
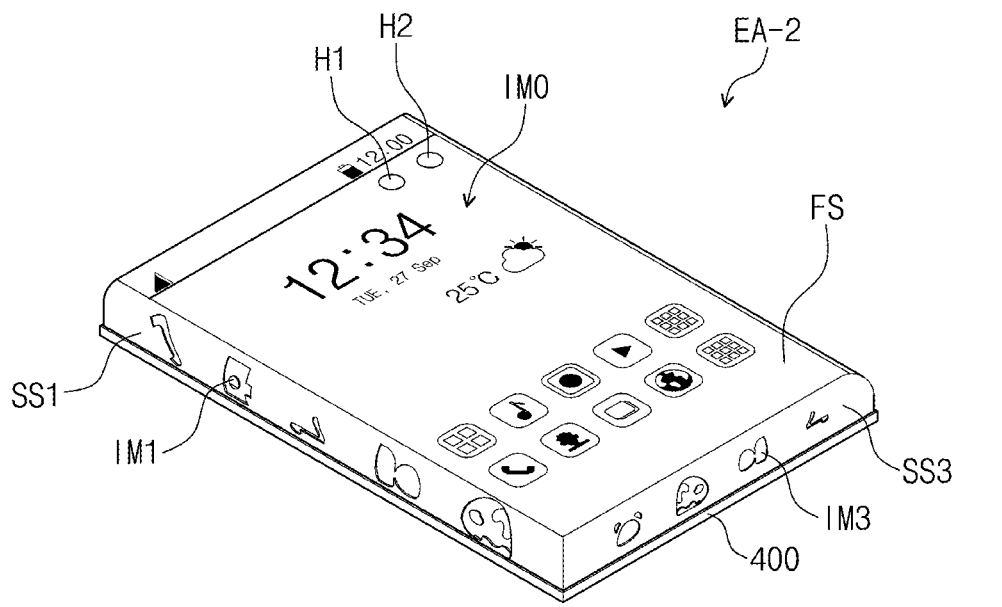
FIG. 11A is a perspective view showing an electronic apparatus according to an exemplary embodiment of the inventive concepts.
Figure 11B:
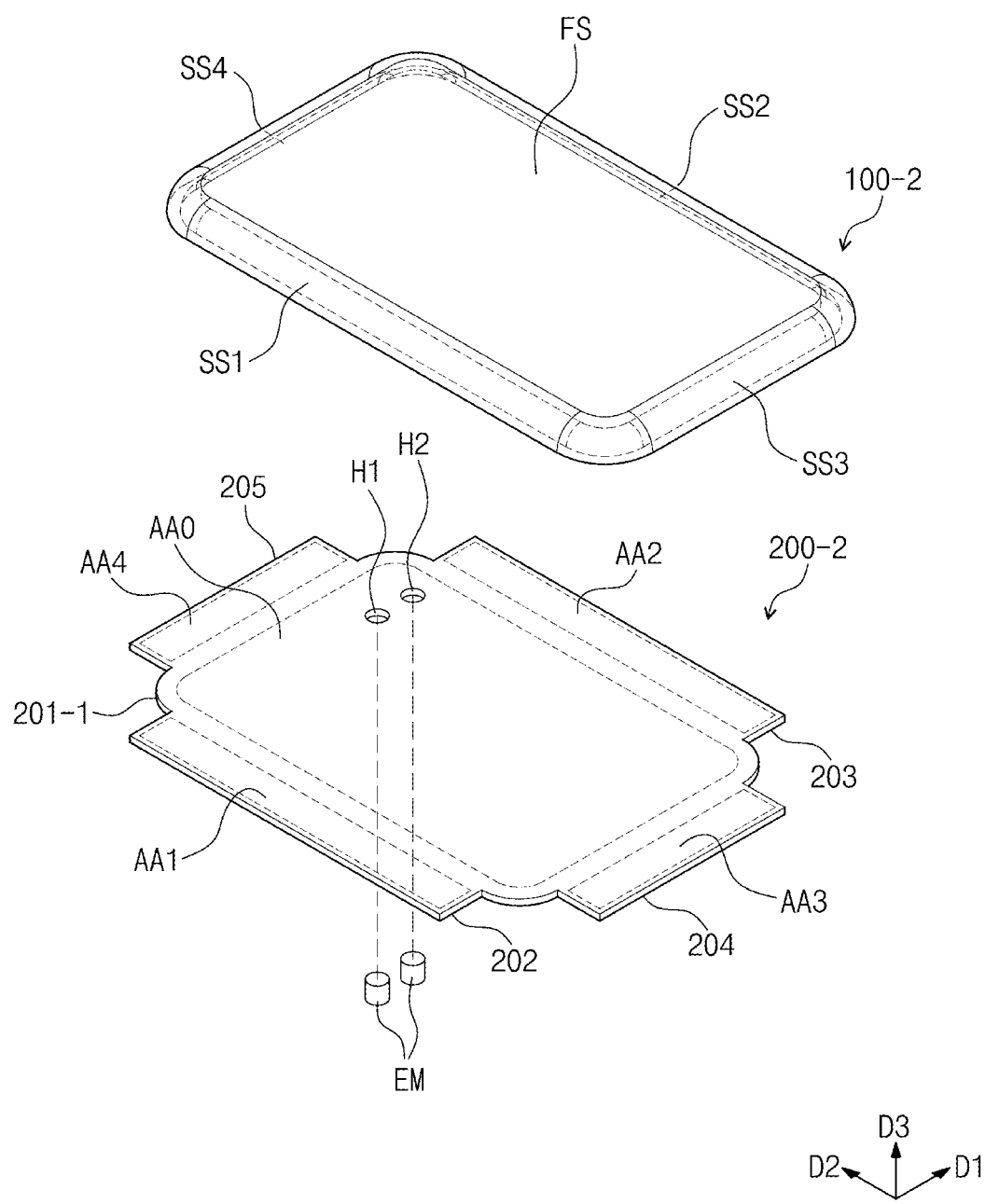
FIG. 11B is an exploded perspective view showing the electronic apparatus shown in FIG. 11A.
Figure 11C:
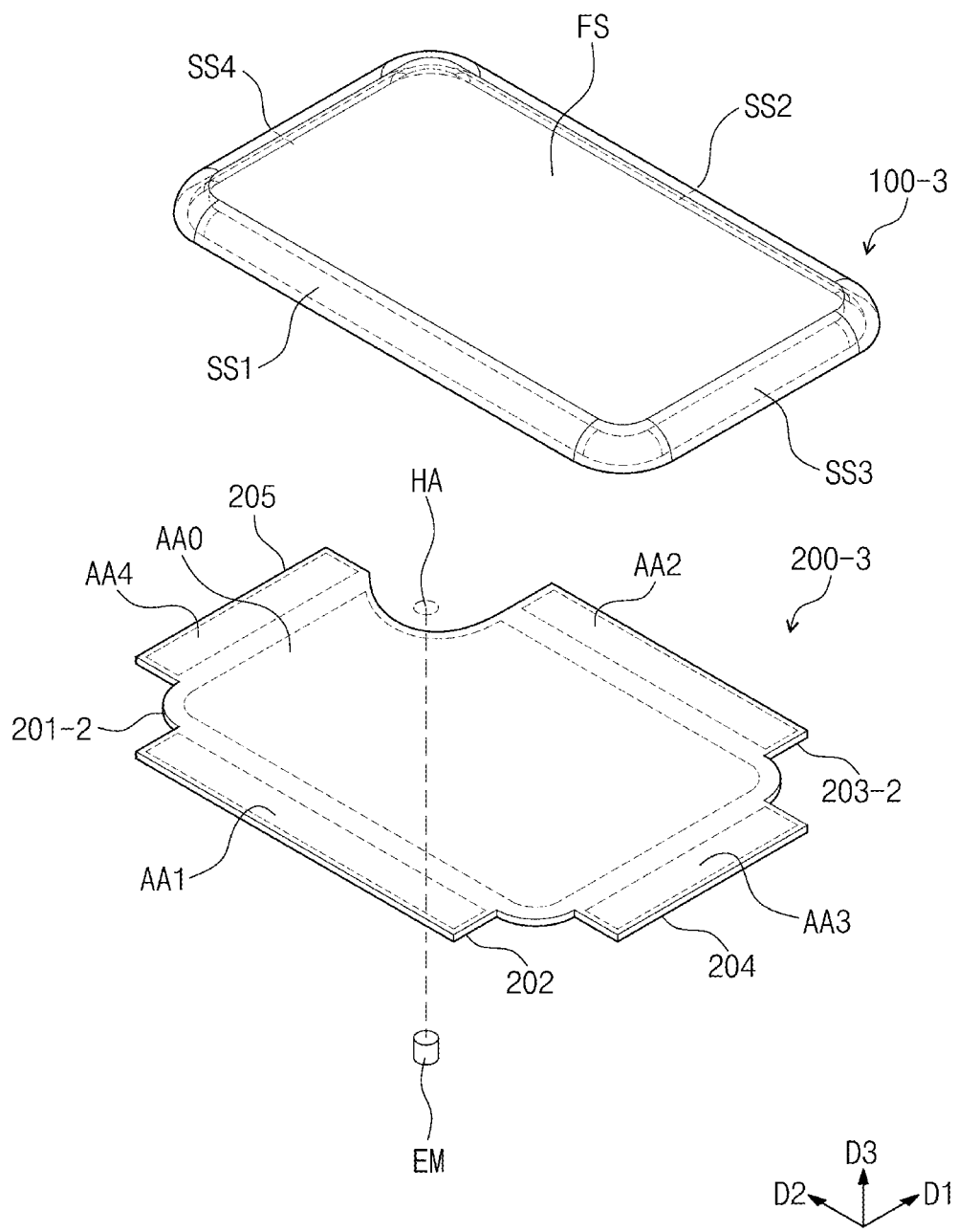
FIG. 11C is an exploded perspective view showing an electronic apparatus according to an exemplary embodiment of the inventive concepts.

FIG. 11A is a perspective view showing an electronic apparatus EA-2 according to an exemplary embodiment. FIG. 11B is an exploded perspective view showing the electronic apparatus EA-2 shown in FIG. 11A. FIG. 11C is an exploded perspective view showing an electronic apparatus according to an exemplary embodiment. For the convenience of explanation, some components are omitted in FIGS. 11B and 11C. Hereinafter, the inventive concepts will be described in detail with reference to FIGS. 11A to 11C. In FIGS. 11A to 11C, the same reference numerals denote the same elements in FIGS. 1A to 10B, and thus detailed descriptions of the same element will be omitted.

Referring to FIGS. 11A and 11B, the electronic apparatus EA-2 may include a window 100-2, an electronic panel 200-2, an electronic module EM, and a housing unit 400. Although not shown in figures, a pressure sensing unit may be provided independent from the electronic panel 200-2 as shown in FIG. 2A or may be provided in an embedded state in the electronic panel 200-2, however, it should not be limited thereto or thereby.

The electronic apparatus EA-2 may further include a hole H1 and H2 defined through a front surface FS thereof. In the present exemplary embodiment, the hole H1 and H2 may be provided in a plural number, and the holes H1 and H2 may be spaced apart from each other. The electronic apparatus EA-2 may display an image IM0, IM1, IM3 and may sense information about an external subject via the holes H1 and H2. The image displayed on each of the second surface SS2 and the fourth surface SS4 are not shown in FIG. 9A.

In detail, the window 100-2 may include the front surface FS and a plurality of side surfaces SS1, SS2, SS3, and SS4. The window 100-2 may substantially correspond to the window 100-1 shown in FIG. 9B.

The electronic panel 200-2 may include a main portion 201-1 and a plurality of cut portions 202, 203, 204, and 205. The electronic panel 200-2 according to the present exemplary embodiment may substantially correspond to the electronic panel 200-1 shown in FIG. 9B except for a through-hole H1 and H2.

The holes H1 and H2 may be defined through the electronic panel 200-2. The holes H1 and H2 may be defined through the main portion 201-1 in an active area AA0.

The electronic module EM may include various functional modules to operate the electronic apparatus EA-2. The electronic module EM may be directly mounted on a mother board electrically connected to the electronic panel 200-2 or may be electrically connected to the mother board via a connector (not shown) after being mounted on a separate substrate. The electronic module EM may include at least one of a camera, a speaker, a light sensing sensor, and a thermal sensing sensor.

In the present exemplary embodiment, the electronic module EM is provided in a plural number. The electronic modules EM may be disposed to overlap with the holes H1 and H2. The electronic modules EM may receive external inputs respectively transmitted via the holes H1 and H2 or may provide outputs respectively via the holes H1 and H2. A portion or all of each of the electronic modules EM may be accommodated in the holes H1 and H2, respectively. According to this embodiment, the electronic modules EM are disposed to overlap with the active area AA0, and thus a bezel area may be prevented from increasing.

As shown in FIG. 11C, the electronic apparatus may include a window 100-3 and an electronic panel 200-3. The window 100-3 may substantially correspond to the window 100-2 shown in FIG. 11B. In the present exemplary embodiment, for the convenience of explanation, the electronic module EM may be provided in a single configuration.

The electronic panel 200-3 according to the present exemplary embodiment may include a main portion 201-2 from which a portion thereof is removed when compared with the electronic panel 200-2 shown in FIG. 11B. The main portion 201-2 may have a shape from which the portion overlapping with the electronic module EM is removed, and a hole area HA that overlaps with the electronic module EM may be defined in an outer portion of the electronic panel 200-3.

As shown in FIGS. 11A to 11C, the electronic panels 200-2 and 200-3 may have various shapes to prevent interference with the electronic module EM. The electronic apparatus EA-2 may prevent the interference with the electronic module EM and may sense the pressure applied to various positions thereof.

Figure 12:
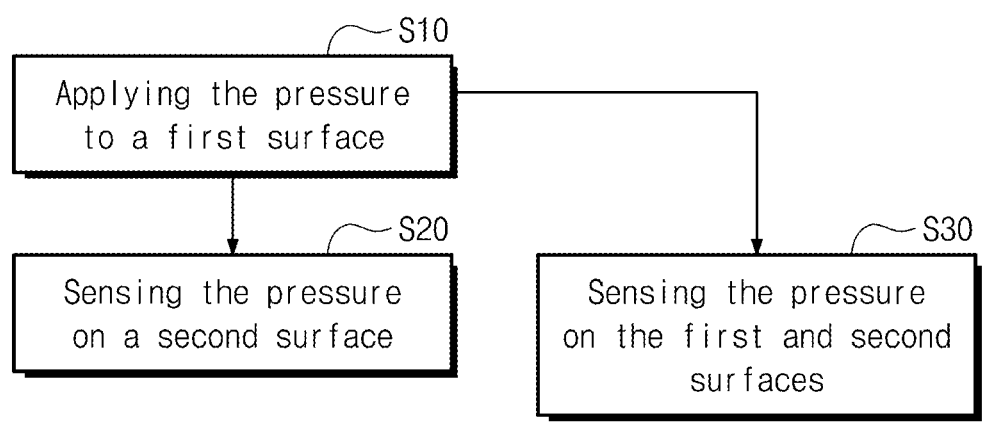
FIG. 12 is a flowchart showing an operation method of an electronic apparatus according to an exemplary embodiment of the inventive concepts.

FIG. 12 is a flowchart showing an operation method of an electronic apparatus according to an exemplary embodiment of the inventive concepts. Referring to FIG. 12, the operation method of the electronic apparatus may include applying the pressure to a first surface (S10) and sensing the pressure on a second surface (S20) or sensing the pressure on the first and second surfaces (S30).

The surface (first surface) to which the pressure is applied may be different from the surface (second surface) from which the pressure is sensed. As described above, the electronic apparatus according to the inventive concepts may sense the pressure from the surface (second surface) opposite to the surface (first surface) to which the pressure is applied. Accordingly, even though the pressure is not accurately sensed due to the surface, to which the pressure is applied, being pushed, the pressure may be sensed from the opposite surface, and thus the sensitivity of the pressure sensing may be improved.

In addition, according to the inventive concepts, the pressure may be substantially simultaneously sensed from the surface (first surface) to which the pressure is applied and the opposite surface (second surface). Therefore, in a case where a pressure-dependent change occurs in the surface to which the pressure is directly applied, the pressure-dependent change may be easily sensed. Accordingly, the accuracy of the pressure sensing may be improved.

Figure 13A:
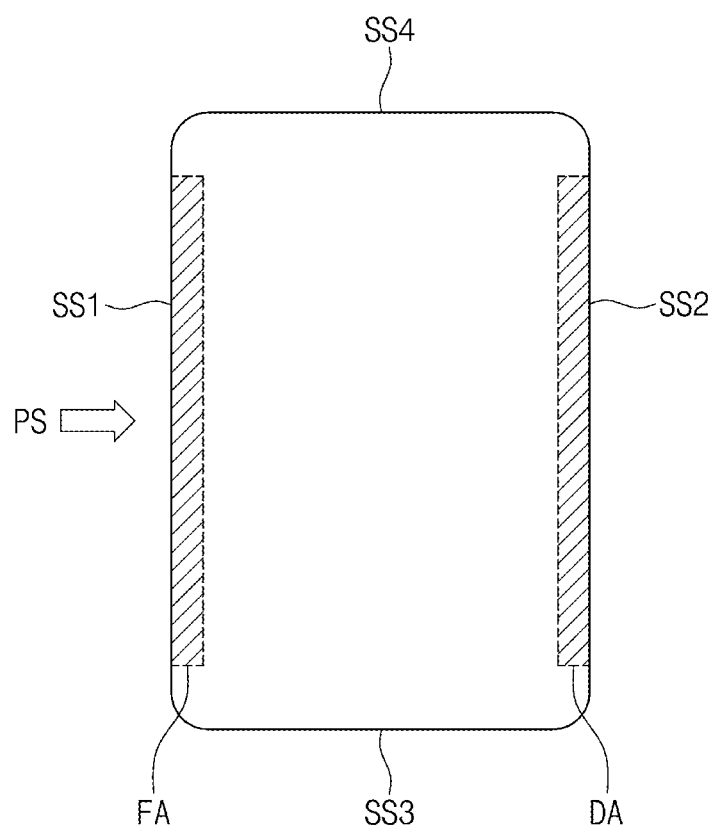
FIGS. 13A and 13B are plan views showing electronic apparatuses according to an exemplary embodiment of the inventive concepts.
Figure 13B:
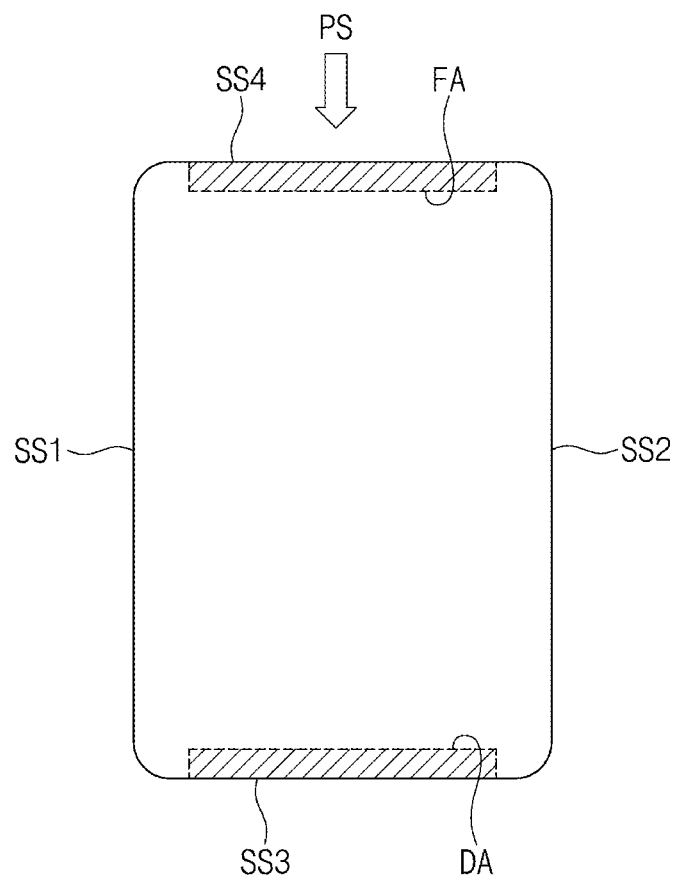
Figure 13C:
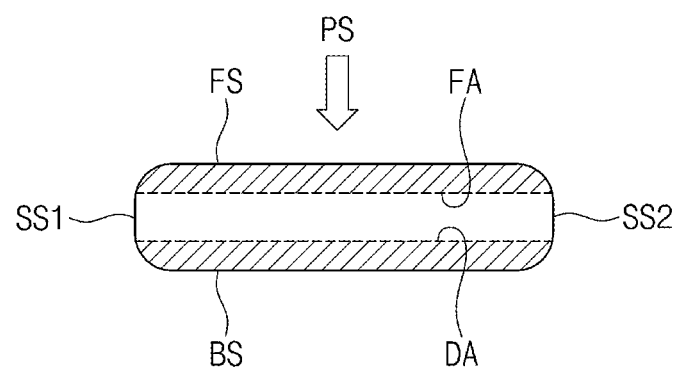
FIG. 13C is a cross-sectional view showing an electronic apparatus according to an exemplary embodiment of the inventive concepts.

FIGS. 13A and 13B are plan views showing electronic apparatuses according to an exemplary embodiment of the inventive concepts. FIG. 13C is a cross-sectional view showing an electronic apparatus according to an exemplary embodiment of the inventive concepts. For the convenience of explanation, some components of the electronic apparatuses are omitted in FIGS. 13A to 13C.

Referring to FIG. 13A, when an external pressure PS is applied to a first side surface SS1, an area FA to which the pressure is applied corresponds to a first side surface SS1, and an area DA from which the pressure is sensed may be defined in a second side surface SS2 opposite to the first surface SS1. That is, in the present exemplary embodiment, a pressure sensing unit may be disposed on at least a second side surface SS2. The pressure sensing unit may sense the pressure applied to the surface opposite to the surface on which the pressure sensing unit is disposed and may provide an improved pressure sensitivity.

Referring to FIG. 13B, when an external pressure PS is applied to a fourth side surface SS4, an area FA to which the pressure is applied corresponds to a fourth side surface SS4, and an area DA from which the pressure is sensed may be defined in a third side surface SS3 opposite to the fourth surface SS4. That is, in the present exemplary embodiment, a pressure sensing unit may be disposed on at least a fourth side surface SS4. The pressure sensing unit may sense the pressure applied to the surface opposite to the surface on which the pressure sensing unit is disposed and may provide an improved pressure sensitivity.

Referring to FIG. 13C, when an external pressure PS is applied to a front surface FS, an area FA to which the pressure is applied corresponds to the front surface FS, and an area DA from which the pressure is sensed may be defined in a rear surface BS opposite to the front surface FS. That is, in the present exemplary embodiment, a pressure sensing unit may be disposed on at least a second side surface SS2. The pressure sensing unit may sense the pressure applied to the surface opposite to the surface on which the pressure sensing unit is disposed and may provide an improved pressure sensitivity.

According to the inventive concepts, the electronic apparatus may sense the pressure from the surface opposite to the surface to which the pressure is applied. Therefore, although there is no direct deformation on the surface to which the pressure is applied, the electronic apparatus may reliably sense the pressure. In addition, according to the inventive concepts, the electronic apparatus may sense the pressure from two surfaces, e.g., the surface to which the pressure is applied and the opposite surface. Thus, the accuracy of the pressure sensing may be improved.

Figure 14A:
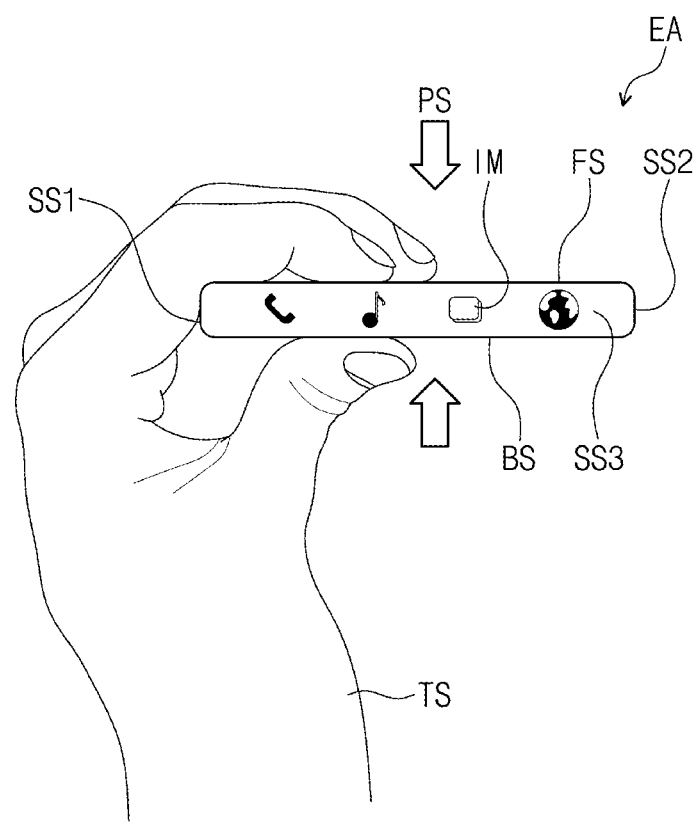
FIGS. 14A and 14B are side views showing an electronic apparatus according to an exemplary embodiment of the inventive concepts.
Figure 14B:
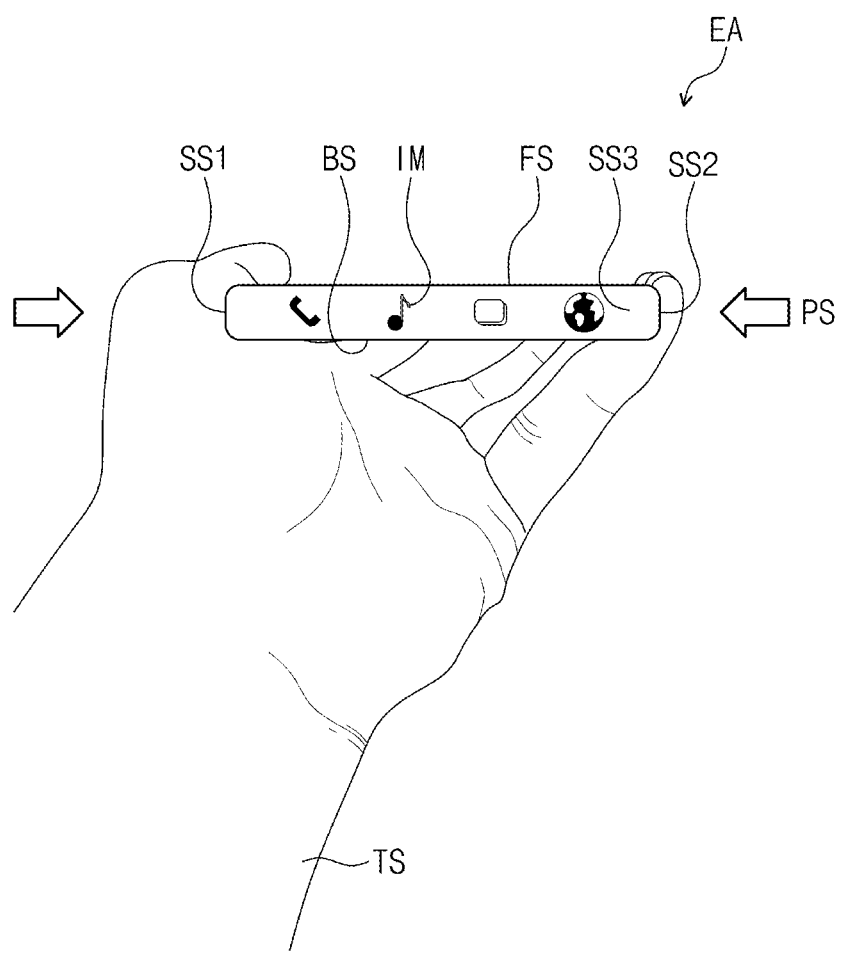

FIGS. 14A and 14B are side views showing an electronic apparatus EA according to an exemplary embodiment of the inventive concepts. For the convenience of explanation, some components of the electronic apparatus are omitted in FIGS. 14A and 14B. As shown in FIGS. 14A and 14B, an external pressure PS applied to the electronic apparatus EA may be substantially simultaneously applied to two surfaces opposite to each other.

For example, as shown in FIG. 14A, the external pressure PS may be substantially simultaneously applied to a front surface FS and a rear surface BS of the electronic apparatus EA. In the electronic apparatus EA shown in FIG. 14A, a pressure sensing unit may be provided to each of the front surface FS and the rear surface BS. In this case, the electronic apparatus EA may sense the pressure from both the front surface FS and the rear surface BS. In this case, the electronic apparatus EA may activate a third side surface SS3 to perform operations, such as displaying an image IM or sensing the external touch. The electronic apparatus EA may activate the third side surface SS3 only when the external pressure PS is sensed at both the front surface FS and the rear surface BS, and thus a variety of user environments may be provided to the user.

As another example, referring to FIG. 14B, the external pressure PS may be substantially simultaneously applied to a first side surface SS1 and a second side surface SS2 of the electronic apparatus EA. In this case, the electronic apparatus EA may sense the pressure from both the first side surface SS1 and the second side surface SS2. The electronic apparatus EA may activate a third side surface SS3 to perform operations, such as displaying an image IM or sensing the external touch. The electronic apparatus EA may activate the third side surface SS3 only when the external pressure PS is sensed at both the first side surface SS1 and the second side surface SS2, and thus a variety of user environments may be provided to the user.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic apparatus comprising:
   a window comprising a front surface and first and second side surfaces bent from the front surface;
   an electronic panel configured to display an image and comprising first and second side surfaces corresponding to the first and second side surfaces of the window;
   first and second pressure sensing units configured to sense an intensity of an external pressure; and
   a housing unit accommodating the first and second side surfaces of the window, the electronic panel, and the first and second pressure sensing units, the housing unit comprising first and second walls corresponding to the first and second side surfaces of the window,
   wherein:
   the first pressure sensing unit is disposed between the first side surface of the window and the first wall of the housing unit; and
   the second pressure sensing unit is disposed between the second side surface of the window and the second wall of the housing unit.

2. The electronic apparatus of claim 1, wherein, when an external pressure is applied to the first side surface of the window, a thickness of the second pressure sensing unit is changed, and the second pressure sensing unit senses the external pressure based on a change of the thickness.

3. The electronic apparatus of claim 1, wherein, when an external pressure is applied to the second side surface of the window, a thickness of the first pressure sensing unit is changed, and the first pressure sensing unit senses the external pressure based on a change of the thickness.

4. The electronic apparatus of claim 1, further comprising:
   a third pressure sensing unit disposed adjacent to the first side surfaces of the window and disposed between a bottom portion of the housing unit and a first bottom portion of the window; and
   a fourth pressure sensing unit disposed adjacent to the second side surfaces of the window and disposed between a bottom portion of the housing unit and a second bottom portion of the window.

5. The electronic apparatus of claim 4, wherein the third pressure sensing unit comprises:
   a first pattern having a conductivity; and
   a second pattern having the conductivity and spaced apart from the first pattern.

6. The electronic apparatus of claim 5, wherein the third pressure sensing unit is configured to sense a variation in capacitance between the first pattern and the second pattern.

7. The electronic apparatus of claim 5, further comprising a first panel that comprises a resin making contact with the first pattern and the second pattern and a plurality of conductive nano-particles distributed in the resin,
   wherein the third pressure sensing unit is configured to sense a variation in resistance of the first panel.

8. The electronic apparatus of claim 1, further comprising an upper pressure sensing unit,
   wherein the electronic panel comprises:
   a base substrate;
   a thin film transistor disposed on the base substrate;
   a light emitting device connected to the thin film transistor; and
   an encapsulation layer covering the light emitting device, and the upper pressure sensing unit is disposed between the base substrate and the window.

9. The electronic apparatus of claim 8, wherein the upper pressure sensing unit is disposed on the encapsulation layer.

10. The electronic apparatus of claim 9, wherein the electronic panel comprises:
    an active area through which the image is configured to be displayed; and
    a peripheral area defined adjacent to the active area, and the upper pressure sensing unit overlaps with the peripheral area.

11. The electronic apparatus of claim 8, wherein the upper pressure sensing unit is disposed between the base substrate and the thin film transistor.

12. The electronic apparatus of claim 8, wherein the upper pressure sensing unit comprises:
    a first sensing insulating layer disposed on the encapsulation layer;
    a second sensing insulating layer disposed on the first sensing insulating layer;
    a first sensing conductive pattern disposed between the first sensing insulating layer and the second sensing insulating layer; and
    a second sensing conductive pattern disposed on the second sensing insulating layer, and the upper pressure sensing unit is disposed on a same layer as the first sensing conductive pattern.

13. The electronic apparatus of claim 12, wherein at least a portion of the second sensing conductive pattern is connected to the first sensing conductive pattern.

14. The electronic apparatus of claim 12, wherein the first sensing insulating layer comprises a resin and a plurality of conductive nano-particles distributed in the resin.

15. The electronic apparatus of claim 12, wherein the electronic panel comprises:
   an active area through which the image is configured to be displayed; and
   a peripheral area defined adjacent to the active area, and the upper pressure sensing unit overlaps with the active area.

* * * * *